(12) United States Patent
Ohmi et al.

(10) Patent No.: US 7,520,245 B2
(45) Date of Patent: *Apr. 21, 2009

(54) PLASMA PROCESSING APPARATUS

(75) Inventors: Tadahiro Ohmi, 1-17-301,
Komegafukuro 2-chome, Aoba-Ku,
Sendai-Shi, Miyagi, 980-0813 (JP);
Masaki Hirayama, Sendai (JP)

(73) Assignees: Tadahiro Ohmi, Miyagi (JP); Tokyo Electron Limited, Tokyo (JP)

( * ) Notice: Subject to any disclaimer, the term of this patent is extended or adjusted under 35 U.S.C. 154(b) by 605 days.

This patent is subject to a terminal disclaimer.

(21) Appl. No.: 10/861,388

(22) Filed: Jun. 7, 2004

(65) Prior Publication Data
US 2004/0221809 A1 Nov. 11, 2004

Related U.S. Application Data

(63) Continuation of application No. 09/678,741, filed on Oct. 4, 2000, now Pat. No. 6,830,652, which is a continuation of application No. PCT/JP00/03365, filed on May 25, 2000.

(30) Foreign Application Priority Data
May 26, 1999 (JP) .................................. 11-186258

(51) Int. Cl.
*C23C 16/511* (2006.01)
*C23C 16/455* (2006.01)
*C23F 1/00* (2006.01)
*H01L 21/306* (2006.01)
*C23C 16/06* (2006.01)
*C23C 16/34* (2006.01)

(52) U.S. Cl. ...................... 118/723 MW; 118/723 ME; 118/723 MA; 118/723 AN; 156/345.34; 156/345.36; 156/345.41

(58) Field of Classification Search .......... 118/723 MR, 118/723 ME, 723 MW, 723 MA, 723 AN; 156/345.35, 345.36, 345.41, 345.42, 345.34
See application file for complete search history.

(56) References Cited

U.S. PATENT DOCUMENTS 4,985,109 A 1/1991 Otsubo et al. .......... 156/345.41

(Continued)

FOREIGN PATENT DOCUMENTS

GB 2 226 049 A 6/1990

(Continued)

OTHER PUBLICATIONS

Supplementary Partial European Search Report.

*Primary Examiner*—Rudy Zervigon
(74) *Attorney, Agent, or Firm*—Pillsbury Winthrop Shaw Pittman, LLP

(57) ABSTRACT

In a microwave plasma processing apparatus, a metal made lattice-like shower plate 111 is provided between a dielectric material shower plate 103, and a plasma excitation gas mainly an inert gas and a process gas are discharged form different locations. High energy ions can be incident on a surface of the substrate 114 by grounding the lattice-like shower plate. The thickness of each of the dielectric material separation wall 102 and the dielectric material at a microwave introducing part is optimized so as to maximize the plasma excitation efficiency, and, at the same time, the distance between the slot antenna 110 and the dielectric material separation wall 102 and a thickness of the dielectric material shower plate 103 are optimized so as to be capable of supplying a microwave having a large power.

8 Claims, 13 Drawing Sheets

U.S. PATENT DOCUMENTS

| | | | |
|---|---|---|---|
| 5,010,842 A * | 4/1991 | Oda et al. | 118/723 ME |
| 5,304,250 A * | 4/1994 | Sameshima et al. | 118/723 ER |
| 5,451,290 A | 9/1995 | Salfelder | |
| 5,525,159 A | 6/1996 | Hama et al. | 118/723 F |
| 5,556,475 A * | 9/1996 | Besen et al. | 118/723 MP |
| 5,698,036 A | 12/1997 | Ishii et al. | 118/723 M |
| 5,834,730 A | 11/1998 | Suzuki et al. | 219/121.43 |
| 5,874,706 A | 2/1999 | Ishii et al. | 219/121.43 |
| 5,891,252 A | 4/1999 | Yokogawa et al. | 118/723 AN |
| 5,955,382 A | 9/1999 | Yamauchi et al. | 438/723 |
| 6,013,155 A | 1/2000 | McMillin et al. | 156/345.33 |
| 6,189,485 B1 | 2/2001 | Matsuda et al. | 118/723 E |
| 6,217,703 B1 * | 4/2001 | Kitagawa | 156/345.33 |
| 6,357,385 B1 * | 3/2002 | Ohmi et al. | 118/723 AN |
| 6,399,520 B1 | 6/2002 | Kawakami et al. | 438/778 |
| 6,446,573 B2 | 9/2002 | Hirayama et al. | 118/723 MW |
| 6,514,347 B2 * | 2/2003 | Denpoh | 118/715 |
| 6,518,195 B1 | 2/2003 | Collins et al. | 438/723 |
| 6,545,420 B1 * | 4/2003 | Collins et al. | 315/111.51 |
| 2003/0178144 A1 * | 9/2003 | Ohmi et al. | 156/345.41 |

FOREIGN PATENT DOCUMENTS

| | | | |
|---|---|---|---|
| JP | 01120810 | | 5/1989 |
| JP | 2-52328 | | 2/1990 |
| JP | 02237020 | A | 9/1990 |
| JP | 3-120382 | A | 5/1991 |
| JP | 060611153 | A | 3/1994 |
| JP | 06-112141 | | 4/1994 |
| JP | 6-260434 | | 9/1994 |
| JP | 7-312348 | A | 11/1995 |
| JP | 08-111297 | | 4/1996 |
| JP | 9-63793 | | 3/1997 |
| JP | 9-115882 | A | 5/1997 |
| JP | 10-64881 | | 3/1998 |
| JP | 10-150026 | A | 6/1998 |
| JP | 11-302824 | | 11/1999 |
| JP | 2000195800 | A * | 7/2000 |
| WO | WO 97/48834 | | 12/1997 |
| WO | WO 98/33362 | | 7/1998 |
| WO | WO 99/00532 | | 1/1999 |

* cited by examiner

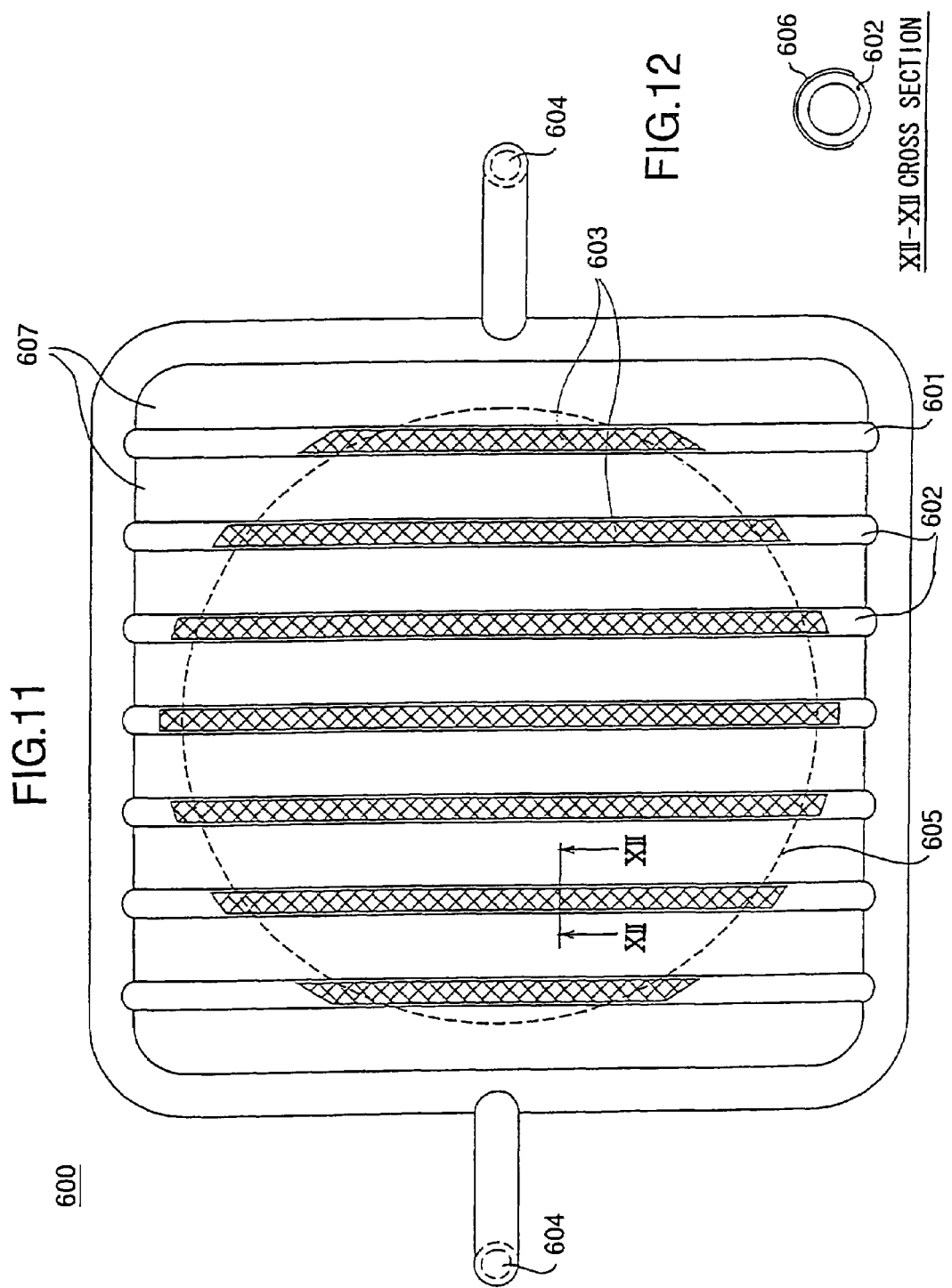

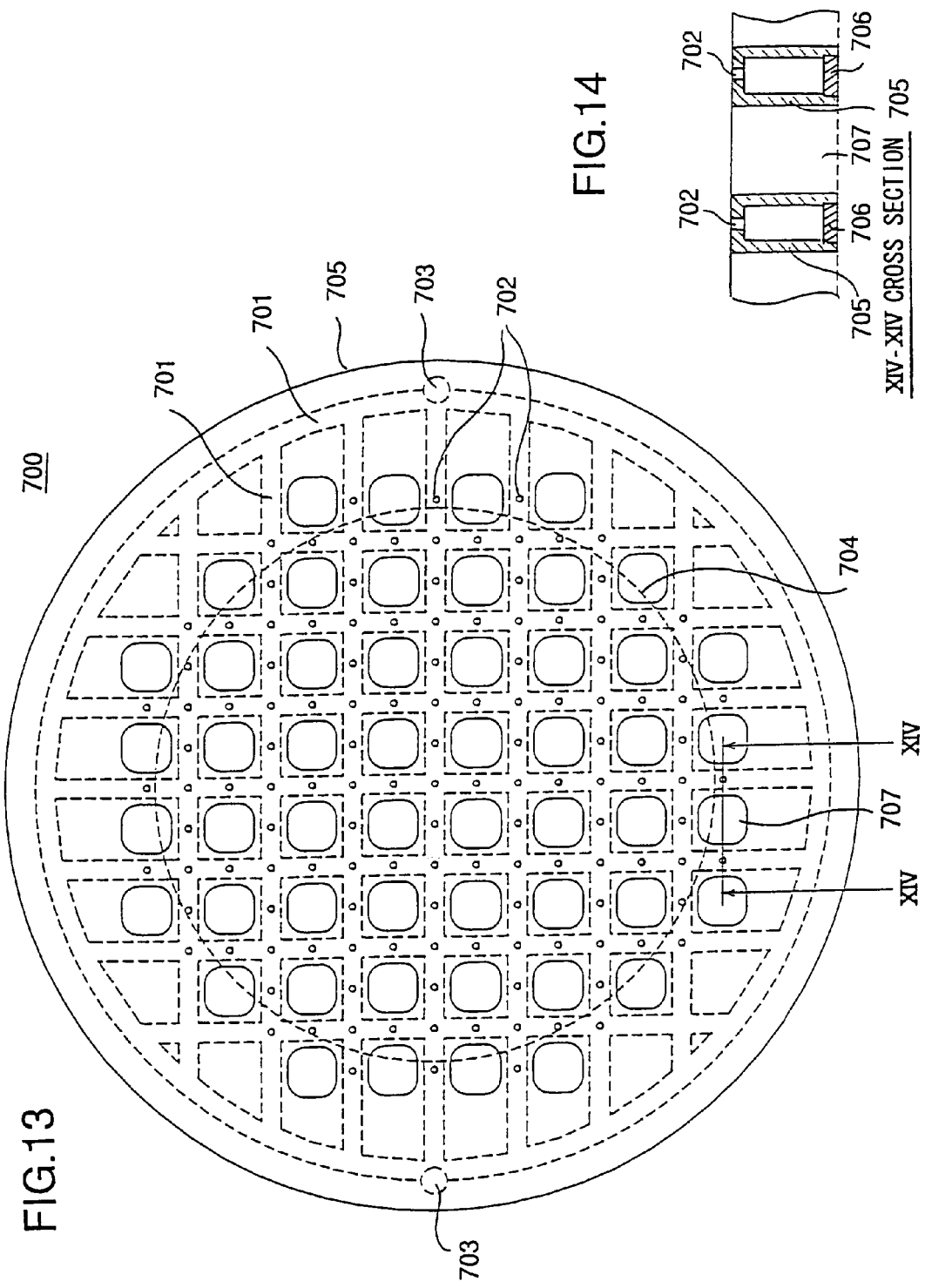

PLASMA PROCESSING APPARATUS

This is a continuation of U.S. patent application Ser. No. 09/678,741, filed on Oct. 4, 2000, which is a continuation of International Application No. PCT/JP00/03365, filed May 25, 2000, the contents of both of which are incorporated herein by reference in their entireties.

TECHNICAL FIELD

The present invention relates to plasma processing apparatuses and, more particularly, to a plasma processing apparatus which is capable of performing a high performance plasma process and has a high electric-power-efficiency and a long maintenance period.

BACKGROUND ART

In recent years, in order to realize semiconductors and liquid crystal displays having a high-performance and high-throughput, a plasma process has become indispensable for manufacturing these products. Although there are various methods for plasma excitation, a parallel plate type RF plasma excitation apparatus or a inductive coupling type plasma apparatus has been used to manufacture semiconductors or liquid crystal displays. These plasma apparatuses have several essential problems in that a large damage is given to a device and a high-performance process at a high-speed cannot be achieved. Accordingly, it has become difficult to satisfy demands of semiconductors and liquid crystal displays to have a high-performance and high-throughput Accordingly, a microwave plasma apparatus has recently been attracting attention, which can excite high-density plasma by a microwave electric field without using a direct current magnetic field. As such kind of micro plasma apparatus, an apparatus (Japanese Laid-Open Patent Application No. 9-63793) is known, which excites plasma by ionzing a gas in a vacuum chamber by a microwave electric field generated by a microwave emitted to the vacuum chamber from a flat antenna (slot antenna) having many slots that are arranged to generate a uniform microwave. Additionally, there is also known an apparatus (WO98/33362), which excites plasma by introducing a microwave, which is emitted by a slot antenna provided outside a vacuum chamber, into the vacuum chamber by being passed through a dielectric material separation wall and a dielectric material shower plate. Since the microwave plasma excited by those methods has a high-density and a low electron temperature, a process having no damage at a high speed can be performed. Additionally, since uniform plasma can be excited even on a large area substrate, it can be easily dealt with an increase in the size of a semiconductor substrate or a liquid crystal display.

However, these conventional microwave plasma apparatuses have a problem in that a substance, which is produced by dissociation and combination of a process gas due to the plasma, adheres onto a surface of the dielectric material separation wall or the shower plate. If a film having a low resistivity is deposited on the surface, the microwave is reflected, and if a film having a high resistivity, the microwave is absorbed. Accordingly, the plasma excitation power is decreased due to adhesion of the substance onto the surface of the dielectric material separation wall or the dielectric material shower plate, which reduces the plasma density and deteriorates stability of the plasma. In the worst case, it becomes a situation in which the plasma cannot be exited. In order to eliminate such a problem, it is necessary to frequently perform a chamber cleaning and maintenance so as to remove the adhered film, which significantly decreases the throughput.

In the reactive ion etching which is indispensable for producing semiconductors or liquid crystal displays, anisotropic etching is achieved by irradiating ions in the plasma onto a substrate surface by accelerating up to 100 eV by an electric filed in a sheath formed between the substrate and the plasma. In order to generate a direct current voltage (self bias voltage) for accelerating the ions to a desired energy in the sheath near the substrate, an RF wave ranging from about several hundreds KHz to about several tens MHz is applied to the substrate. Since the plasma can be regarded as a conductive material, the RF voltage applied to the substrate is divided into that the sheath near the substrate and the sheath near the grounded part. That is, if the RF wave is applied to the substrate, the RF voltage is applied not only to the sheath near the substrate but also to the sheath near the grounded part, and, thereby, the DC voltage of the sheath near the grounded part is increased and a plasma potential is increased. If the plasma potential becomes greater than 15 to 30 V, contamination occurs due to sputtering of the surface of the grounded part due to bombardment of the accelerated ions.

A ratio of the RF voltages applied to the sheath near the substrate and the sheath near the grounded part is determined by impedances of these sheathes. If the impedance of the sheath near the grounded part is much smaller than the impedance of the sheath near the substrate, a most part of the RF voltage applied to the substrate is applied to the sheath near the substrate. That is, if the area of the grounded part to which the plasma contacts is sufficiently larger than the area of the substrate electrode (normally, more than four times), the plasma potential is not increased when a RF wave is applied to the substrate. Thus, a problem associated with the contamination due to the sputtering can be avoided. Additionally, a large DC voltage can be efficiently generated in the sheath near the substrate.

However, in the conventional microwave plasma apparatus, since the opposing surface of the substrate is covered by a dielectric material in its entirety, the area of the grounded part to which the plasma contacts cannot be large. Normally, an area of the grounded part to which the plasma contacts is less than about three times the area of the substrate electrode. Accordingly, it is difficult to apply to an reactive ion etching such as a process in which a high energy ions must be bombarded to a substrate surface.

In a process for forming a thin film containing a metal such as metal thin film , feroelectric film, and high dielectric thin film by CVD (chemical vapor deposition) method, and an organometallic gas which is a compound of metal atoms and organic molecules is used. If the bonds between the metal atoms and the organic molecules is selectively cut off, a thin film having a good characteristic which causes no impurity contamination will be formed. However, if the organic molecules are decomposed, a large amount of carbon impurity atoms are mixed into the film, which deteriorates the characteristic of the thin film. Additionally, in the etching process, if the dissociation of the process gas progresses in excess, the selectivity between the film to be etched and a resist mask or the underlying material is deteriorated, and it becomes difficult to etch a fine pattern having a large aspect ratio. In the conventional microwave plasma processing apparatus, the process gas is directly introduced into an area close to a position at which the microwave is incident and having a high plasma density and a relatively high electron temperature. Thereby, the dissociation of the process gas progresses in excess, and a good result cannot be obtained in formation of a thin film using an organometallic gas or fine pattern etching.

When a microwave is incident on plasma, the microwave propagates in the plasma if the electron density if smaller than the cutoff density $n_c$ represented by the following equation.

$$n_c = \epsilon_0 \omega^2 m_0/e^2$$

where $\epsilon_0$ is a permittivity of dielectric ratio of vacuum; $\omega$ is microwave angular frequency, $m_0$ is a mass of an electron, and e is a charge of an electron. On the other hand, if the electron density is higher than the cutoff density, the microwave is reflected in the vicinity of a plasma surface. At this time, the microwave penetrates into the plasma by a penetration length (normally, several millimeters to ten millimeters), and gives energy to electrons in the plasma so that the plasma is maintained. In to the microwave plasma excitation, if the electron density is lower than the cutoff density, uniform and stable plasma cannot be excited due to dispersion of the microwave in the chamber. In order to excite uniform and stable plasma, it is indispensable to reflect a large part of the microwave by exciting plasma having an electron density sufficiently higher than the cutoff density in the vicinity of the surface on which the microwave is incident. In order to excite a stable plasma having a high electron density, an inert gas such as Ar is preferably used as the plasma excitation gas. If a gas other than a monatomic molecule gas is added, it tends to deteriorate the stability of the plasma due to the electron density being decreased since the energy of the microwave is used for dissociation of the gas molecules. In the conventional microwave plasma apparatus, since only a small amount (several percent) of gas other than the inert gas can be added, there is a problem in that process window is narrow and it cannot deal with a high speed process.

When the electron density in the vicinity of the plasma surface is higher than the cutoff density, a large part of the microwave incident on the plasma is reflected in the vicinity of the surface. The reflected wave is received by the slot antenna, and, thereafter, emitted form the slot antenna by being reflected by a matching unit connected between the slot antenna and the microwave power source. The microwave gradually provides its energy to the plasma while repeatedly reflected between the plasma surface and the matching unit. That is, the microwave is in a resonant state in a part between the plasma surface and the matching unit. Accordingly, a high energy density microwave is present in this part, and a large loss is caused due to a small conductive loss of a metal wall of the waveguide or a small dielectric loss of the dielectric material. In the conventional microwave plasma apparatus, these losses are large, and, thereby, the plasma excitation power efficiency was low. Additionally, if a large power microwave is supplied so as to obtain a high-density plasma, an arc discharge is generated in a slot part formed on the surface of the slot antenna. Thereby, there is a problem in that the antenna is broken or a discharge occurs in a gas passage between the dielectric material separation wall and the dielectric material shower plate.

DISCLOSURE OF INVENTION

It is a general object of the present invention to provide an improved and useful plasma processing apparatus in which the above-mentioned problems are eliminated.

A more specific object of the present invention is to provide a plasma processing apparatus which can generate a plasma having high stability even if any process gas is used since there is no film deposition due to dissociation and combination of the process gas on a surface of a dielectric material shower plate of a microwave introducing part.

It is another object of the present invention to provide a plasma processing apparatus of which chamber cleaning period or a maintenance period is long.

It is a further object of the present invention to provide a plasma processing apparatus which can deal with a process in which a high-ion-energy must be incident on a substrate surface.

Additionally, it is another object of the present invention to provide a plasma processing apparatus which can perform an excellent film deposition process or etching process due to an appropriate control of dissociation of the process gas, and can achieve a high plasma excitation efficiency.

In order to achieve the above-mentioned objects, a new process gas discharge unit (referred to as a lattice-like shower plate) is provided to a plasma diffusion part (between a dielectric material shower plate and a substrate) of the conventional microwave plasma processing apparatus so that the plasma excitation gas mainly containing an inert gas and the process gas can be discharged from different locations. Additionally, by grounding the metal made lattice-like shower plate, the apparatus can deal with a process in which high-energy ions must be incident on a surface of the substrate which process cannot be performed by a conventional microwave plasma processing apparatus. Further, a thickness of a dielectric material part of a microwave introducing part is optimized so as to maximize an efficiency of plasma excitation, and, at the same time, a thickness of the dielectric material shower plate and a distance between a slot antenna and a dielectric material separation wall are optimized so as to be capable of supplying a microwave having a large power.

The plasma processing apparatus of the present invention has a structure in which the new gas discharging means (lattice-like shower plate) is provided between the dielectric material shower plate of the conventional microwave plasma processing apparatus and a substrate, and a process gas of which dissociation is preferably suppressed is discharged toward the substrate. On the other hand, in order to prevent the process gas from diffusing toward the dielectric material shower plate, the plasma excitation gas mainly containing an inert gas is discharged from the dielectric material shower plate which is located on opposite side of the lattice-like shower plate with respect to the substrate. Since a film is not deposited on a surface of the dielectric material shower plate which is a path of the microwave, a chamber cleaning period or a maintenance period can be increased, and a stable plasma can be always obtained. Additionally, since a state in which a process gas rarely present can be formed near a surface on which a microwave having a high plasma density and a high electron temperature is incident, the dissociation of the process gas is suppressed and a high-performance process can be achieved. At the same time, since stable plasma having a high density sufficiently greater than a cutoff density can be excited near a surface on which the microwave is incident even if a large amount of process gas is discharged from the lattice-like shower plate, a freedom of the process is greatly improved, and a higher-speed process can be achieved.

An area of the grounded part to which the plasma contacts is greatly increased by introducing the grounded metal made lattice-like shower plate into the plasma. When a RF bias is applied to the substrate, a large part of the RF voltage can be applied to a sheath near the substrate, and, thereby, the energy of ions incident on the surface of the substrate can be efficiently increased without increasing a potential of the plasma. Accordingly, the present invention can be effectively applied to a process such as a reactive ion etching in which a high ion-energy must be incident on a surface of a substrate.

Additionally, according to the plasma processing apparatus of the present invention, an efficiency of excitation of the plasma is maximized by optimizing a thickness of the dielectric material part of the microwave introducing part (a thickness of the dielectric material separation wall plus a thickness of the dielectric material shower plate), and, at the same time, a microwave having a large power can be supplied by optimizing a thickness of the dielectric material shower plate and a distance between the slot antenna and the dielectric material separation wall, and, thereby a more stable and high-density plasma can be efficiently produced. The metal-made lattice-like shower plate is constituted by a stainless steel and aluminum having an aluminum oxide film which has an excellent resistance to the plasma of a corrosive gas, and is usable for a long time.

Other objects, features and advantages of the present invention will become more apparent from the following detailed description when read in conjunction with the accompanying drawings.

BRIEF DESCRIPTION OF THE DRAWINGS

FIG. 11 is a plan view of a lattice-like shower plate, which is formed of a porous ceramic, provided in a microwave plasma processing apparatus according to a second embodiment of the present invention viewed from a side of a substrate.

FIG. 12 is a cross-sectional view taken along a line XII-XII of FIG. 11.

FIG. 13 is a plan view of a lattice-like shower plate, which is formed of aluminum, provided in a microwave plasma processing apparatus according to a third embodiment of the present invention viewed from a side of a substrate.

FIG. 14 is a cross-sectional view taken along a line XIV-XIV of FIG. 13.

BEST MODE FOR CARRYING OUT THE INVENTION

A description will now be given, with reference to the drawings, of plasma processing apparatuses according to embodiments of the present invention, but, the present invention is not limited to the embodiments.

EMBODIMENT 1

Figure 1:
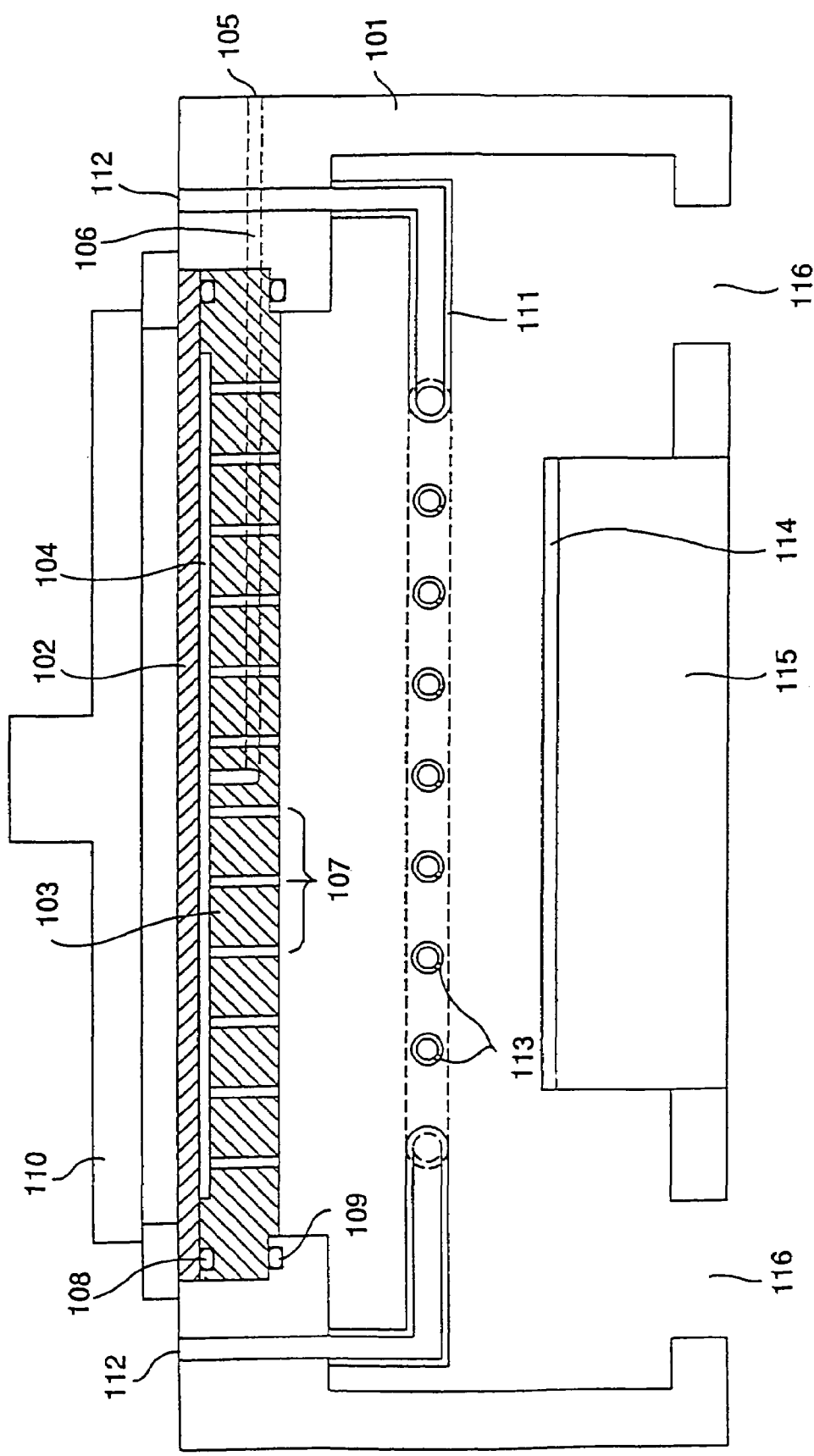
FIG. 1 is a cross-sectional view of a microwave plasma processing apparatus according to a first embodiment of the present invention.

FIG. 1 is a cross-sectional view of a plasma processing apparatus according to a first embodiment of the present invention. The plasma processing apparatus according to the first embodiment of the present invention comprises a vacuum chamber 101, a dielectric material separation wall 102, a dielectric material shower plate 103, a gap 104, a plasma excitation gas supply port 105, a plasma excitation gas introducing passage 106, plasma excitation gas discharge holes 107, O-rings 108 and 109, a radial line slot antenna 110, a lattice-like shower plate 111, process gas supply ports 112, process gas discharge holes 113, a stage 115 and exhaust ports 116. A substrate 114 to be processed by plasma is placed on the stage 115.

In the present embodiment, the vacuum chamber 101 is formed of aluminum, and the dielectric material separation wall 102 and the dielectric material shower plate 103 are formed of aluminum nitride having a relative permittivity of 8.63. A frequency of a microwave for plasma excitation is 2.45 GHz. The substrate 114 is a silicon substrate having a diameter of 200 mm.

A microwave emitted by the radial line slot antenna 110 located in an atmosphere is introduced into an interior of the vacuum chamber 101 by being passed through the dielectric material separation wall 102, the gap 104 and the dielectric material shower plate 103, and generates plasma by ionizing a gas in the vacuum chamber 101.

The apparatus has a structure in which a plasma excitation gas and a process gas can be discharged from different shower plates. The plasma excitation gas is supplied from the plasma excitation gas supply port 105, and is lead to the center of the dielectric material shower plate 103 by being passed through the plasma excitation gas introducing passage 106. Thereafter, the plasma excitation gas flows in the gap in a radial direction from the center to the periphery, and is discharged from the plurality of plasma excitation holes 107 to the interior of the vacuum chamber. On the other hand, the process gas is supplied to the process gas supply ports 112, and is passed through an interior of the lattice-like shower plate 11 which is constituted by a metal pipe, and is discharged from the plurality of process gas discharge holes 113 to the side of the substrate 114.

Figure 2:
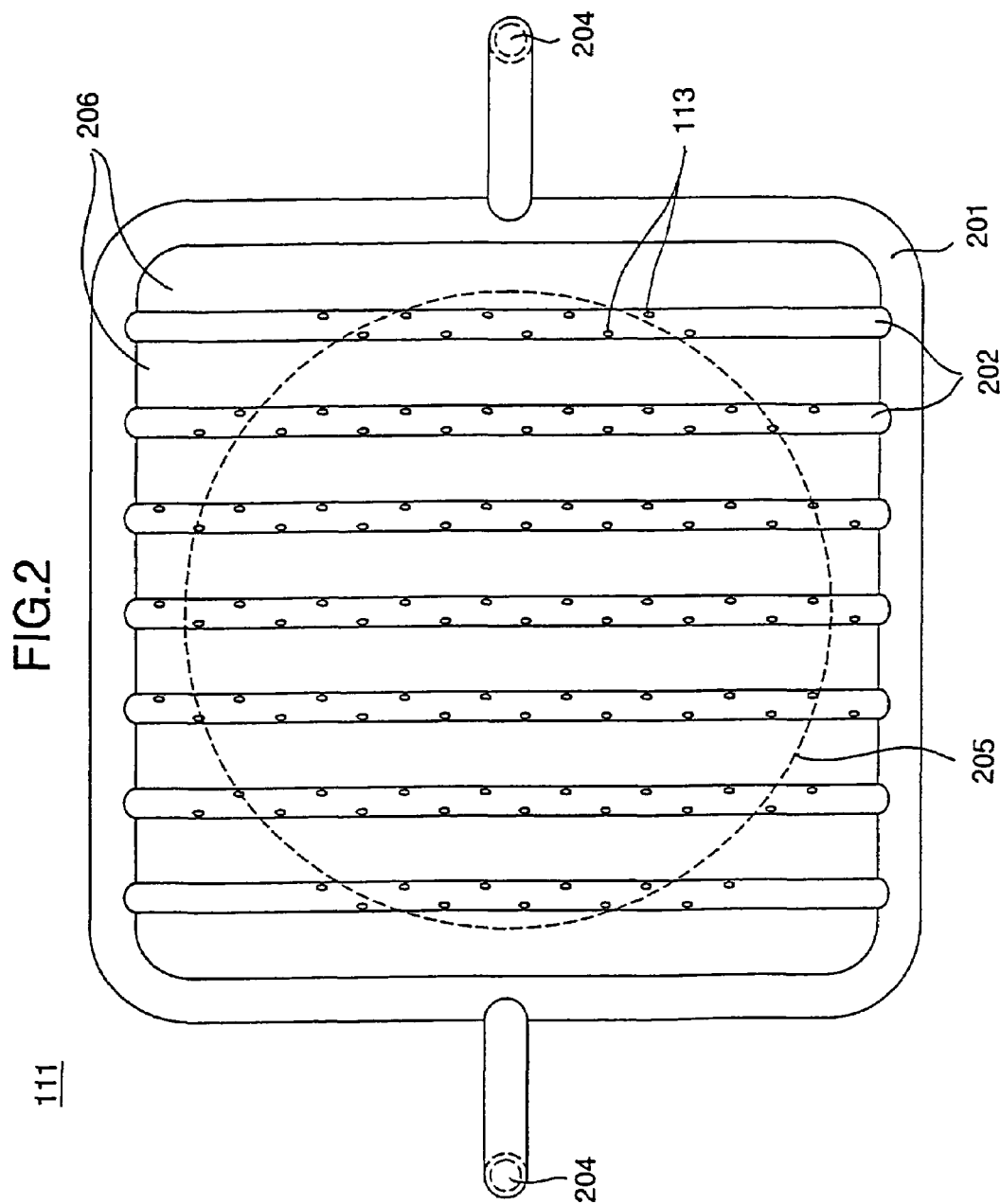
FIG. 2 is a plan view of a lattice-like shower plate shown in FIG. 1 viewed from a side of a substrate.

FIG. 2 is a plan view of the lattice-like shower plate 111 viewed from the side of the substrate 114. The lattice-like shower plate 111 comprises a main pipe 201, branch pipes 202, the process gas discharge holes 113 and lattice-like shower plate gas supply ports 204. A circle 205 indicated by a dashed line is an area facing the substrate 114. In the present embodiment, two lattice-like shower plate gas supply ports 204 are provided so as to evenly discharge the gas onto the substrate 114. The main pipe 201 and the branch pipes 202 are metal pipes having other diameter of 9.53 mm (⅜ inches) and 6.35 mm (¼ inches), respectively, and connection parts therebetween are welded. The branch pipes 202 are positioned in a lattice arrangement, and openings 206 are formed between the main pipe 201 and the branch pipes 202. The branch pipes 202 are provided with many gas discharge holes 113 at positions at which the process gas is obliquely incident on the surface of the substrate evenly over the entire surface of the substrate. In the present embodiment, although the process gas is obliquely incident on the surface of the substrate evenly over the entire surface of the substrate. In the present embodiment, although the process gas is obliquely incident on the surface of the substrate so as to improve surstrate in plane unifomity of a process, the process gas may be vertically incident on the surface of the substrate.

In the present embodiment, a high-density aluminum containing stainless steel, which contains a larger amount of an aluminum component (4.16%) than that of the conventionally used stainless steel SUS316L, is used for the material of the pipes, and the pipes are treated at a high temperature (900° C.) in a low oxidization atmosphere so as to form an aluminum oxide passivation film, which is extremely thermodynamically stable, on the surfaces of the pipes so that the pipes can be semi-permanently used eave in a corrosive gas plasma atmosphere. It has been found that the formation of the aluminum oxide passivation film provides an excellent corrosion resistance with respect to plasma of a corrosive gas such as chlorine gas or fluorine gas The radial line slot antenna 110, the dielectric material separation wall 102, the dielectric material shower plate 103, the lattice-like shower plate 111 and the substrate 114 are positioned parallel to each other. A distance between the dielectric material shower plate 103 and the lattice-like shower plated 111 is set to a quarter (30 mm) of a wavelength of the microwave in a vacuum; a distance between the surface of the dielectric material separation wall 120 facing the antenna 110 and the surface of the dielectric material shower plate 103 facing the substrate 114 is set to three quarters 30.7 mm including the gap 104 of 0.7 mm) of a wavelength of the microwave in the corresponding part; a thickness of the dielectric material shower plate 103 is set to a half (20 mm) of a wavelength of the microwave in the corresponding part. Further, a distance between the radial line slot antenna 110 and the dielectric material separation wall 102 is set to a quarter (30 mm) of a wavelength of the microwave.

If the lattice-like shower plate 111 shown in FIG. 2 is situated in the chamber, a contamination may occur since the material of the shower plate is sputtered by bombardment of ions from the plasma onto a surface of the shower plate and the sputtered material enters near the surface of the substrate. A sheath is formed near a surface of an object inserted into plasma, and ions in the plasma are accelerated by the electric field in the sheath and incident on the surface of the object. If the energy of the incident ions is equal to or greater than a threshold value peculiar to the material or the ions, a sputtering occurs, but if less than the threshold value, no sputtering occurs. For example, when $Ar^+$ ions are incident on a surface of various metals, the threshold value is about 10 eV to 30 eV. In order to prevent a contamination due to sputtering, the energy of ions incident on the lattice-like shower plate 111 is preferably reduced to about 10 eV.

Figure 3:
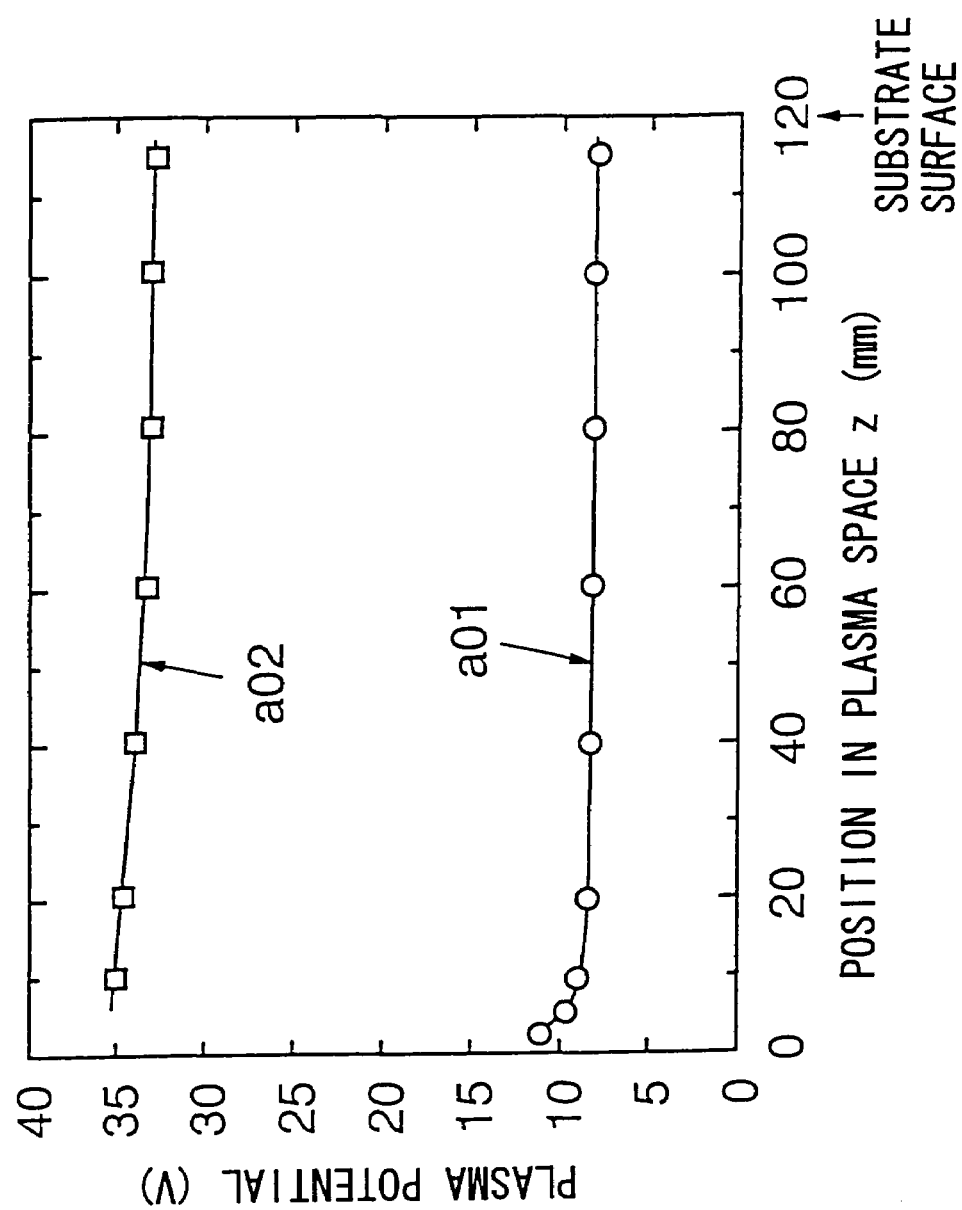
FIG. 3 is a graph showing a distribution of plasma potential in a plasma space.

The energy (eV) of the ions incident on a surface of a grounded part in plasma is almost equal to a voltage eVp, where Vp is a plasma potential and e is a charge of an electron. Also if the surface of the grounded object is covered by an insulating film, the energy is almost the same value. FIG. 3 is a graph showing a distribution of a plasma potential in a plasma space. In FIG. 3, a01 indicates a result obtained by the microwave plasma processing apparatus shown in FIG. 1, and a02 indicates a result obtained by an RF excitation parallel plate type plasma processing apparatus. A distance of the plasma space was 120 mm, the gas was Ar and a pressure was about 67 Pa for both cases. In FIG. 3, the horizontal axis Z represents a position in the plasma space in a direction vertical to the substrate, and a surface of the dielectric material shower plate 103 was set as a reference in the microwave plasma processing apparatus and the surface of the RF applying electrode was set as a reference in the parallel flat plate type plasma processing apparatus. It should be noted that a 2.45 GHz microwave was introduced by being passed through the dielectric material shower plate 103, and a 3.56 MHz RF wave was applied to the RF applying electrode so as to generate plasma.

In the parallel plate type plasma processing apparatus, the plasma potential is about 33 V, and it is apparent a contamination occurs due to sputtering if the lattice-like shower plate 111 is situated in the chamber. On the other hand, in the microwave plasma processing apparatus, since the plasma potential is less than 8 V at a position away from the dielectric material shower plate 103 by a distance more than 20 mm, there is no possibility of sputtering even if the lattice-like shower plate 111 is situated in the plasma. Although there are inductively coupled plasma apparatus and an electron cyclotron resonance plasma apparatus as other plasma apparatuses used for a semiconductor manufacturing process, the plasma potential is higher than 30 V in any apparatus. As mentioned above, the microwave plasma apparatus has a feature that the plasma potential is extremely low as compared to other plasma apparatuses. This is caused by an electron temperature being controlled low over entire plasma including a plasma excitation part. Such an effect can be firstly provided without occurrence of contamination due to sputtering by combining the lattice-like shower plate 111 and the microwave plasma apparatus.

Figure 4:
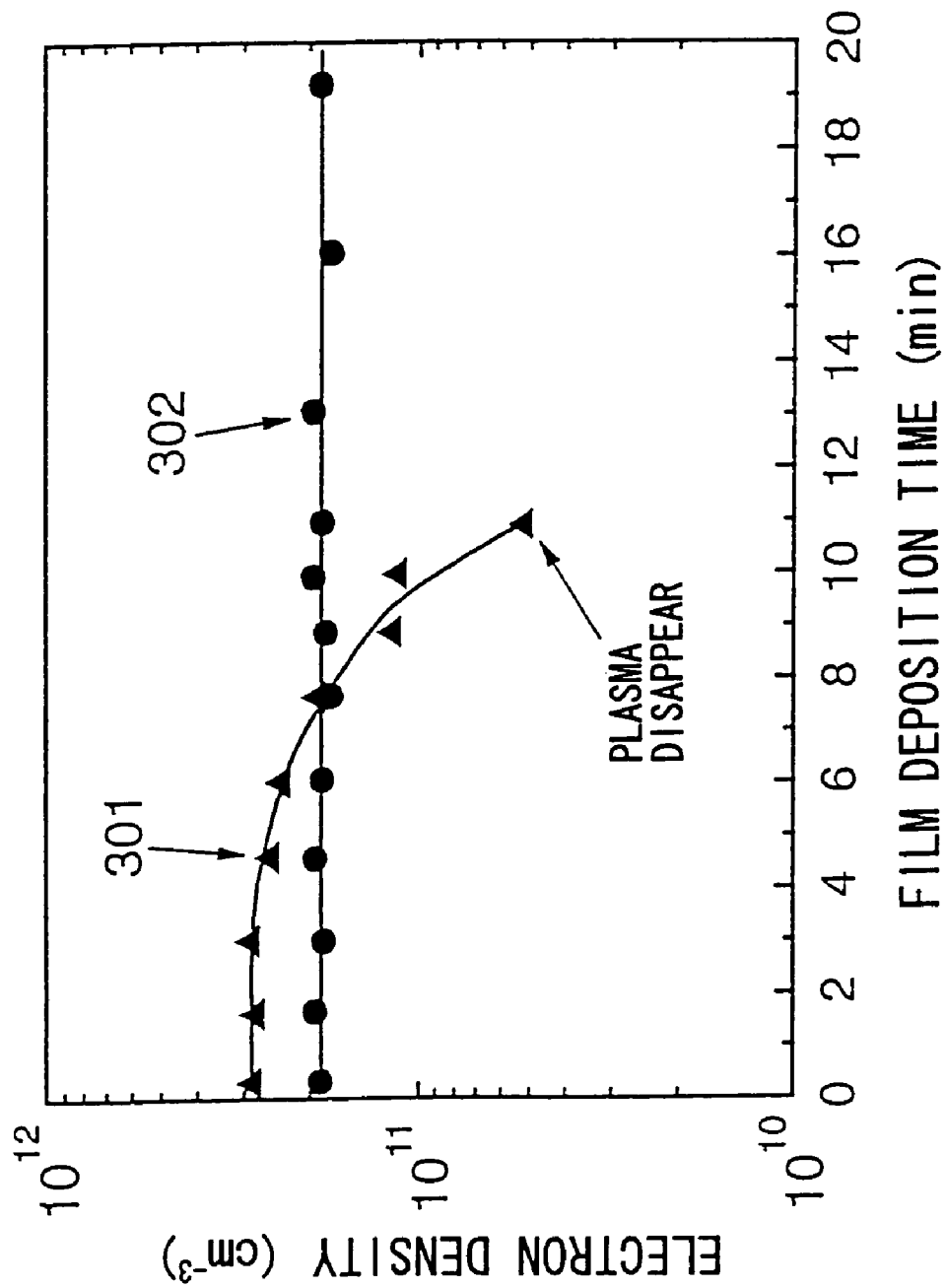
FIG. 4 is a graph showing a variation in an electron density with respect to time when deposition of tantalum is performed.

Experiments were performed for forming a tantalum thin film on a 200 mm diameter silicon substrate covered by a silicon oxide film according to a plasma CVD (chemical vapor deposition) method. FIG. 4 shows a result of measurement of variations of an electron density in the plasma with respect to passage of deposition time after start of deposition of a tantalum film in a state in which deposited materials on a surface of the dielectric material shower plate 103 is completely removed. A curve 301 indicates a result of a conventional microwave plasma apparatus structure, that is, in a case in which the plasma excitation gas and the process gas are mixed and discharged together from the dielectric material shower plate 103 without providing the lattice-like shower plate 111. A curve 302 indicates a result of the microwave plasma apparatus structure according to the present invention, that is, in a case in which the plasma excitation gas and the process gas are separately discharged by providing the lattice-like shower plate 111.

The measurement of the electron density was performed at a position away from a wafer by 15 mm along a center axis of the wafer. As for the process gas, a gas produced by bubbling Ar carrier gas in liquefied $Ta(O-C_2H_5)5$ was used. As for the plasma excitation gas, Ar was used. Flow rate of the process gas and the plasma excitation gas ware 150 sccm and 500 sccm, respectively, and the pressure in the vacuum chamber was about 80 Pa (0.6 Torr). A frequency of the microwave for plasma excitation was 2.45 GHz, and a power thereof was 1.1 kW.

In the conventional structure, the electron density was gradually decreased after a deposition time of 3 minutes has passed and the plasma became unstable, and finally the plasma disappeared when 11 minutes has passed. This is because the tantalum film deposited on the surface of the dielectric material shower plate 103 reflected and absorbed the microwave. As a result of accrual analysis of the film deposited on the surface of the dielectric material shower plate 103, it was found that a tantalum film containing a large amount of carbon was deposited. An average thickness of the tantalum film was 4.3 µm.

On the other hand, in the structure according to the present invention, the electron density did not change even if the deposition was performed for 20 minutes, and deposition of the tantalum film on the surface of the dielectric material shower plate 103 was not found. The reason for the electron density being slightly lower than that of the conventional structure immediately after a start of deposition is that the plasma is slightly prevented from diffusing to a periphery of the wafer due to the presence of the lattice-like shower plate 111. In the conventional structure, since the tantalum film was deposited on the surface of the shower plate during film deposition, cleaning of an inner surface and maintenance of the chamber using chlorine gas plasma or the like must be frequently performed after film deposition, which was uneconomical and reduced a throughput. However, in the structure of the present invention, very little cleaning and maintenance were needed, which resulted in a remarkable improvement in the throughput.

A description will now be given of a result of evaluation on a characteristic of the tantalum thin film formed on the silicon oxidation film. When an amount of carbon contained in the tantalum thin film was measured by a secondary ion mass spectrograph, the amount of carbon according to the conventional structure was as large as 10.5%, while the amount of carbon according to the structure of the present invention was 0.3%. In the conventional structure, since the organic metal gas was discharged from the dielectric material shower plate 103, the gas molecules were decomposed in excess by plasma having a high density and a relatively high temperature in the vicinity of a surface on which the plasma is incident, and organic materials having a small molecular weight were produced and the organic materials were incorporated into the film. However, in the structure of the present embodiment, since the organic metal gas was discharged from the lattice-like shower plate 111 to a plasma diffusion area in which an electron temperature was low, the coupling between the tantalum atom and the organic molecule was selectively cutoff, and, thereby, only organic materials having a high vapor pressure were produced.

Further, when an electric resistivity of the tantalum thin film, the resistivity was $225 \times 10^{-6}$ Ωcm due to a large amount of carbon contained therein in the conventional structure, while the resistivity was $21 \times 10^{-6}$ Ωcm which was lower more a single digit lower than that of the conventional structure, and it was found that an almost ideal thin film was formed. As mentioned above, the characteristic of the thin film can be greatly improved by applying the plasma processing apparatus according to the present invention to a CVD process of a metal thin film, a feroelectric thin film or a high permittivity thin film.

Figure 5:
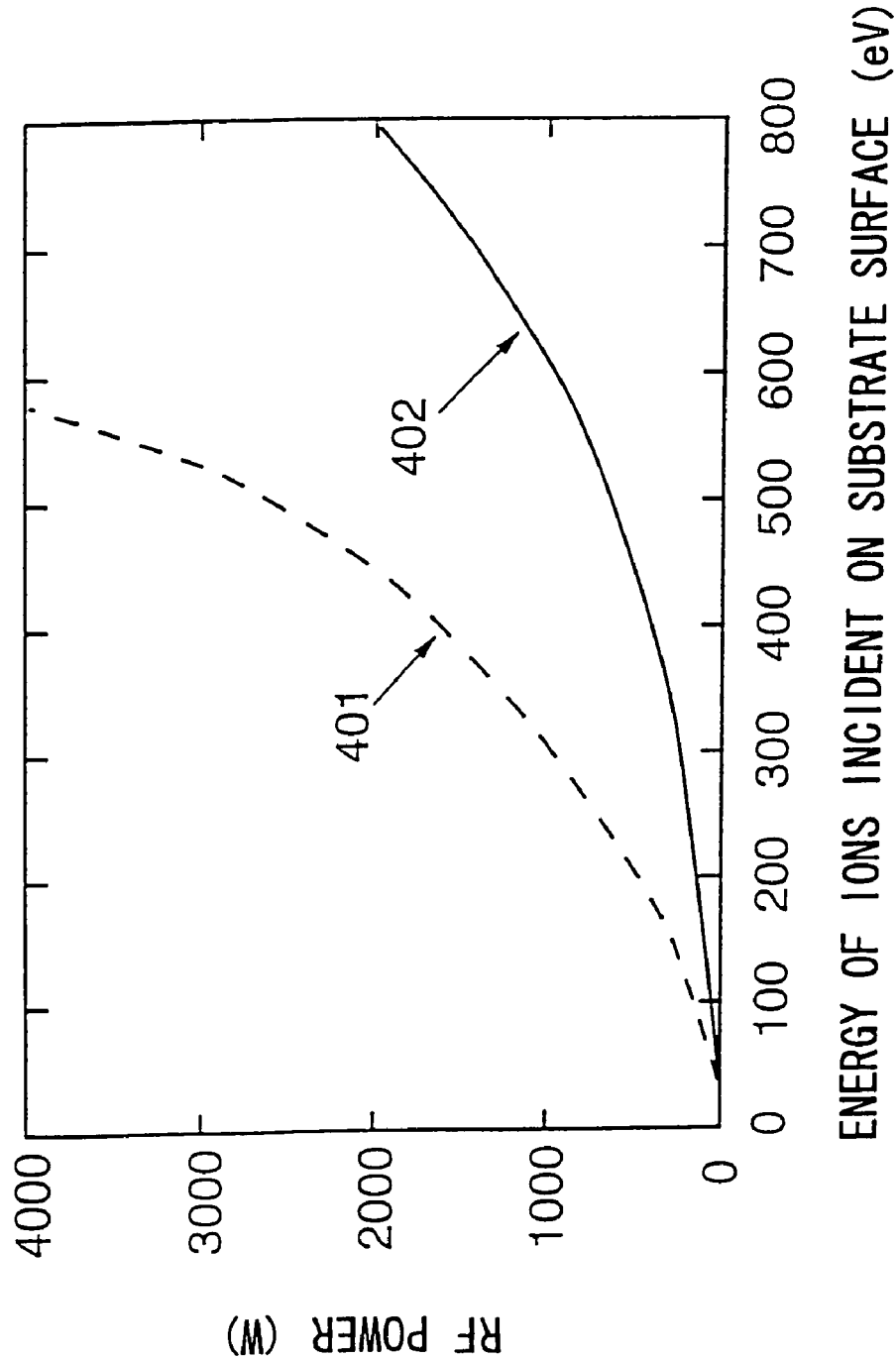
FIG. 5 is a graph showing a dependency of a RF electric power applied to a substrate with respect to ion energy incident on the surface of the substrate.

A description will now be given of compatibility of the microwave plasma apparatus to an etching process. FIG. 5 is a graph showing how much RF power must be applied to the substrate so as to obtain energy of ions incident on the surface of the substrate necessary for etching. A curve 401 indicates a result of the structure of the conventional microwave plasma apparatus, that is, a case in which the grounded lattice-like shower plate 111 is not present, and a curve 401 indicates a result of the structure of the microwave plasma apparatus according to the present invention, that is, a case in which the grounded lattice-like shower plate 111 is present. As for the plasma excitation gas, Ar was used. A pressure in the vacuum chamber was about 4 Pa (30 mTorr), a frequency of the microwave for plasma excitation was 2.45 GHz, and an electric power was 1.1 kW. Additionally, a frequency of the RF applied to the substrate was 2 MHz.

According to FIG. 5, it can be interpreted that according to the structure of the present invention it is sufficient to apply about one fifth of the RF power of the conventional structure so as to obtain an energy of ions incident on a surface of the same substrate. That is, a remarkable increase in an efficiency and miniaturization and cost reduction of an RF power source and a matching unit can be achieved.

Figure 6:
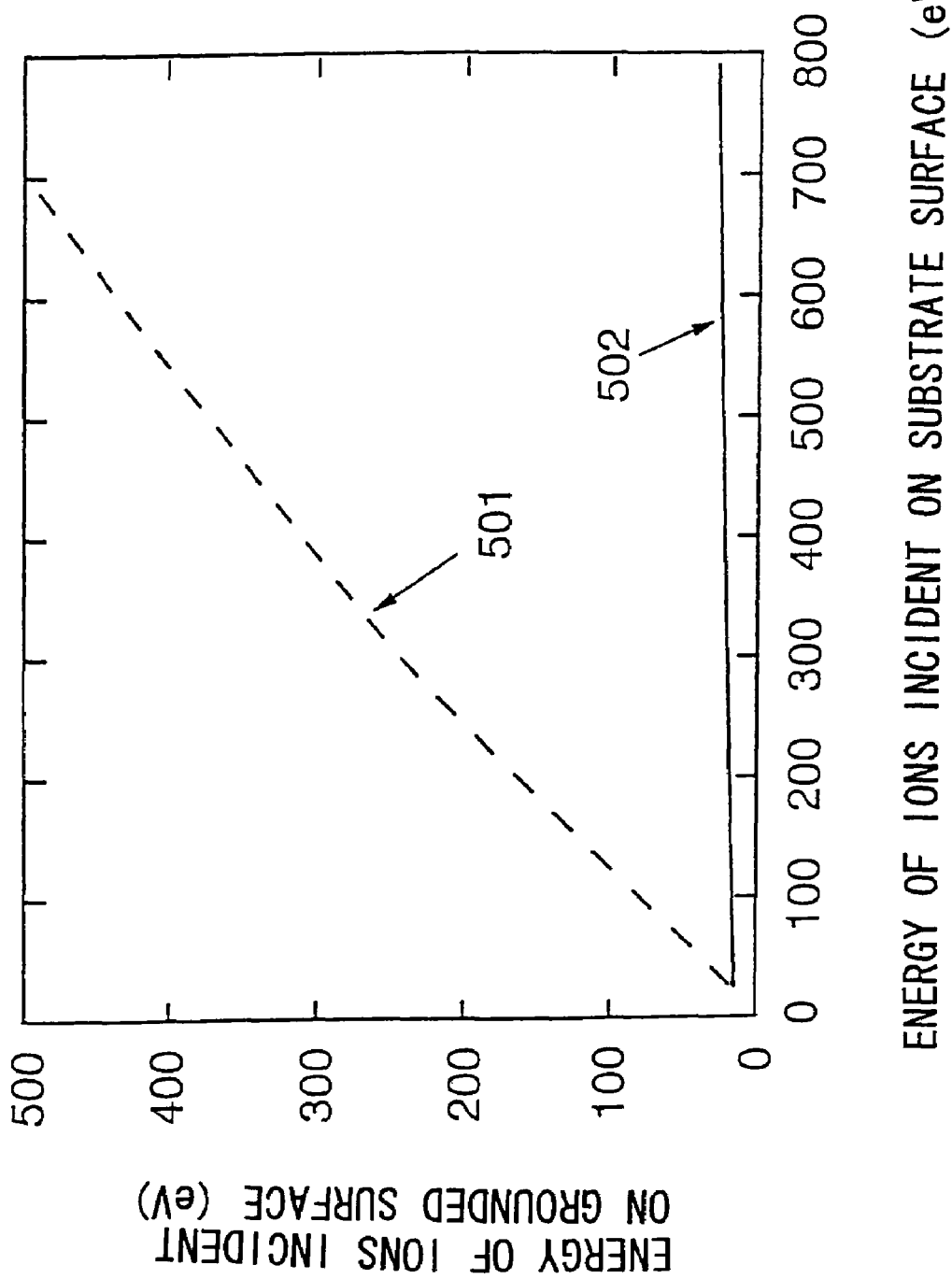
FIG. 6 is a graph showing a dependency of ion energy incident on a surface of a grounded part with respect to ion energy incident on the surface of the substrate.

FIG. 6 is a graph showing a variation in the energy of ions incident on a surface of a grounded part when a power necessary for obtaining the energy of ions incident on the surface of the substrate for etching is applied to the substrate. A curve 501 indicates a result of the structure of the conventional microwave plasma apparatus structure, that is, a case in which the grounded lattice-like shower plate 111 is not present, and a curve 501 indicates a result of the structure of the microwave plasma apparatus according to the present invention, that is, a case in which the grounded lattice-like shower plate 111 is present. Other conditions are the same as the case of FIG. 5.

It can be appreciated from FIG. 6 that, in the conventional structure, the energy of ions incident on the surface of the grounded part is a very high value as high as the energy of ions incident on the surface of the substrate. For example, in a reactive ion etching of a silicon oxide film, ions having about 400 eV must be incident on the surface of the substrate. In order to obtain the energy of incident ions, an RF electric power of 1600 W must be applied to the substrate, and, thereby, the energy of ions incident on the surface of the grounded part becomes 370 eV. If ions having such a high energy of movement are incident on the surface of the grounded part of the chamber wall or the lattice-like shower plate, the wall surface is sputtered which causes an impurity contamination. Additionally, since the wall surface is removed by sputtering, a service life is extremely shortened. On the other hand, in the structure of the present invention, since the area of the surface of the grounded part to which the plasma contacts is sufficiently larger that the area of the substrate, the energy of ions incident on the surface of the grounded part is reduced to a low value ranging from 10 eV to 20 eV, and, thus, the surface of the grounded part is not subject to sputtering.

Table 1 shows: an etching selectivity of a resist to a silicon oxide film when etching is performed on the silicon oxide film on a surface of a silicon substrate; an etching selectivity of a silicon nitride film to a silicon oxidation film which is indispensable for forming a self-aligning contact; and a result of measurement of a contact resistance between an underlying silicon and an aluminum electrode which is formed after forming a 0.25 µm contact hole having a silicon oxide film.

TABLE 1

Comparison of etching characteristics when etching is performed by a conventional apparatus and the apparatus according to the present invention.

|  | Using conventional apparatus | Using apparatus of the present invention |
|---|---|---|
| Etching selectivity of a resist to a silicon oxide film | 4.8 | 10.9 |

TABLE 1-continued

Comparison of etching characteristics when etching is performed by a conventional apparatus and the apparatus according to the present invention.

|  | Using conventional apparatus | Using apparatus of the present invention |
|---|---|---|
| Etching selectivity of a silicon nitride film to a silicon oxide film | 18 | 38 |
| Contact resistance for a contact diameter of 0.25 μm | 3.7 Ω | 0.48 Ω |

As for the plasma excitation gas, Ar was used. The flow rate of the plasma excitation gas was 320 sccm. Additionally, as for the process gas, a mixture gas of $C_4F_8/CO/O_2/Xe$ was used. The flow rate of the process gas was 105 sccm. The pressure in the vacuum chamber was about 4 Pa (30 mTorr). The frequency of the RF wave applied to the surface of the substrate was 2 MHz. The power of the RF wave applied to the substrate was set so that the energy of ions incident on the surface of the substrate becomes 400 eV.

In order to realize a next generation ultra fine high-performance semiconductor device, the selectivity between a resist and a silicon oxide film must be equal to or greater than 10, and the selectivity between a silicon nitride film and a silicon oxide film must be equal to or greater than 30. In the conventional structure, a sufficient etching selectivity cannot be obtained with respect to both the resist and the silicon nitride film since decomposition of fluorocarbon gas progresses in excess which generates a large amount fluorine radicals or fluorine ions causing a decrease in the selectivity. Additionally, since the surface of the grounded part such as a chamber wall is subjected to sputtering and sputtered material enter a silicon surface on the bottom of the contact hole, a contact resistance becomes very high. Since it cannot be used for a device as it is, there is needed a process of removing a damaged layer in the vicinity of the surface of the silicon, which causes an increase in a semiconductor manufacturing cost and a decrease in the productivity.

On the other hand, according to the structure of the present invention, since the process gas is introduced into a portion of the plasma diffusion part in an electron temperature is extremely low, decomposition of fluorocarbon gas is appropriately suppressed, and a sufficient etching selection ratio can be obtained for both the resist and the silicon nitride film. Additionally, since there is no impurity contamination, the contact resistance is controlled to be small.

Figure 7:
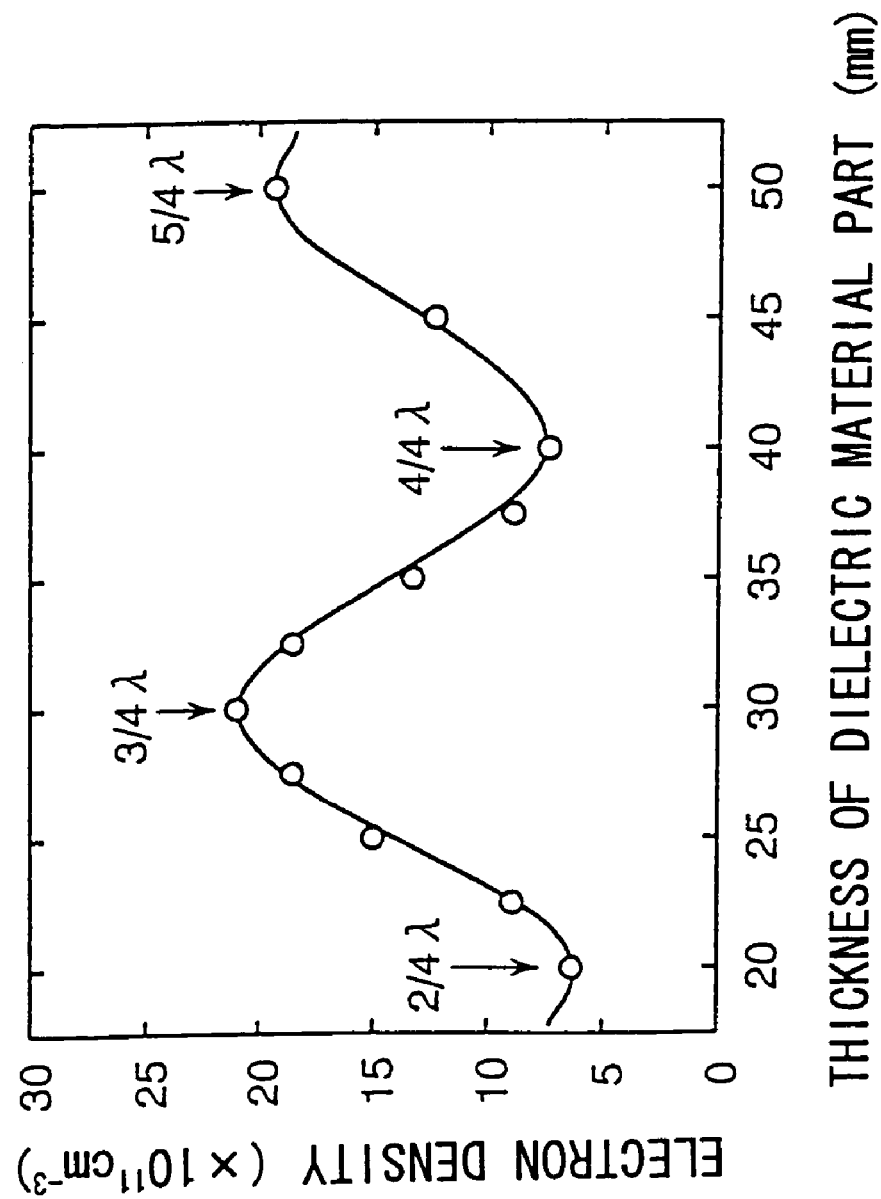
FIG. 7 is a graph showing a dependency of an electron density with respect to a thickness of a dielectric material part.

FIG. 7 is a graph showing a result of measurement of variations of an electron density in plasma when the thickness of the dielectric material part (the thickness of the dielectric material separation wall 102+the thickness of the dielectric material shower plate 103) is changed while a supplied microwave power is maintained constant. The frequency of the microwave was 2.45 GHz, and the microwave power was 1.8 kW. The gap 104 was 0.7 mm. The gas was Ar, and a pressure thereof was 67 Pa (500 mTorr). The electron density was measured at a point away from the dielectric material shower plate by 22 mm.

It was found from FIG. 7 that the electron density in the plasma varies periodically with the thickness of the dielectric material part. The efficiency of plasma excitation (a power used for plasma excitation/a power supplied by the microwave power source) is proportional to the electron density. In the present embodiment, the efficiency of plasma excitation periodically varied in a range from 21% to 75% with the variation in the thickness of the dielectric material part. This phenomenon can be explained as follows.

The electron density (higher than $10^{12}$ cm$^{-3}$) near the surface on which the microwave is incident is sufficiently higher than a cutoff density ($45 \times 10^{10}$ cm$^{-3}$), the microwave incident on the plasma surface cannot enter the plasma deeper than an entering length (about 3 mm) from the surface of the plasma. The reflected microwave is received by the antenna, and, thereafter, reflected by the matching unit and emitted from the antenna. That is, a space between the plasma surface and the matching unit is in a resonant state. In this space, a microwave having a high-energy density is present, and, thereby, a large loss is generated due to a small conductor loss or a small dielectric loss of the dielectric material in the slot antenna. If the loss is larger than a power supplied from the microwave to the plasma, the power density of the microwave between the plasma surface and the matching unit rarely depends on a state of the plasma. On the assumption that the power density of the microwave in the resonator is constant, the power density of the microwave in the dielectric material part is maximized when the thickness of the dielectric material part is such that the surface thereof facing the antenna is at a position corresponding to a loop of the standing wave of the microwave electric field, and the plasma can be most effectively excited. On the contrary, the power density of the microwave in the dielectric material part is minimized when the thickness of the dielectric material part is such that the surface thereof facing the antenna is at a position corresponding to a node of the standing wave of the microwave electric field, and the efficiency of plasma excitation becomes lowest. In order to locate the surface of the dielectric material part facing the antenna at a position of the loop of the standing wave of the microwave electric field, a distance between the surface of the dielectric material separation wall facing the antenna and the surface of the dielectric material shower plate facing the substrate is set equal to an odd multiple of a quarter of the wavelength in the corresponding part. This is because the surface of the dielectric material shower plate 103 facing the substrate can be regarded as a short-circuit plane (position of a node of the standing wave) due to the presence of the plasma which can be regarded as a conductor. It can be appreciated from FIG. 7 that the thickness of the dielectric material part at which the electron density takes a maximum value is 30 mm and 50 mm. These values correspond to the distance between the surface of the dielectric material separation wall facing the antenna and the surface of the dielectric material shower plate facing the substrate being three quarters and five quarters of the wavelength, respectively.

In the conventional structure, since the thickness of the dielectric material part is determined based on only a mechanical strength thereof, there are many cases in which the efficiency of plasma excitation is low, and the efficiency varies for each apparatus. In the structure of the present invention, the efficiency of plasma excitation is as high as 75%, and reaches 3.6 times that of the conventional structure at a maximum. That is, high-density plasma can be generated by a small, inexpensive microwave power source with less power consumption.

Figure 8:
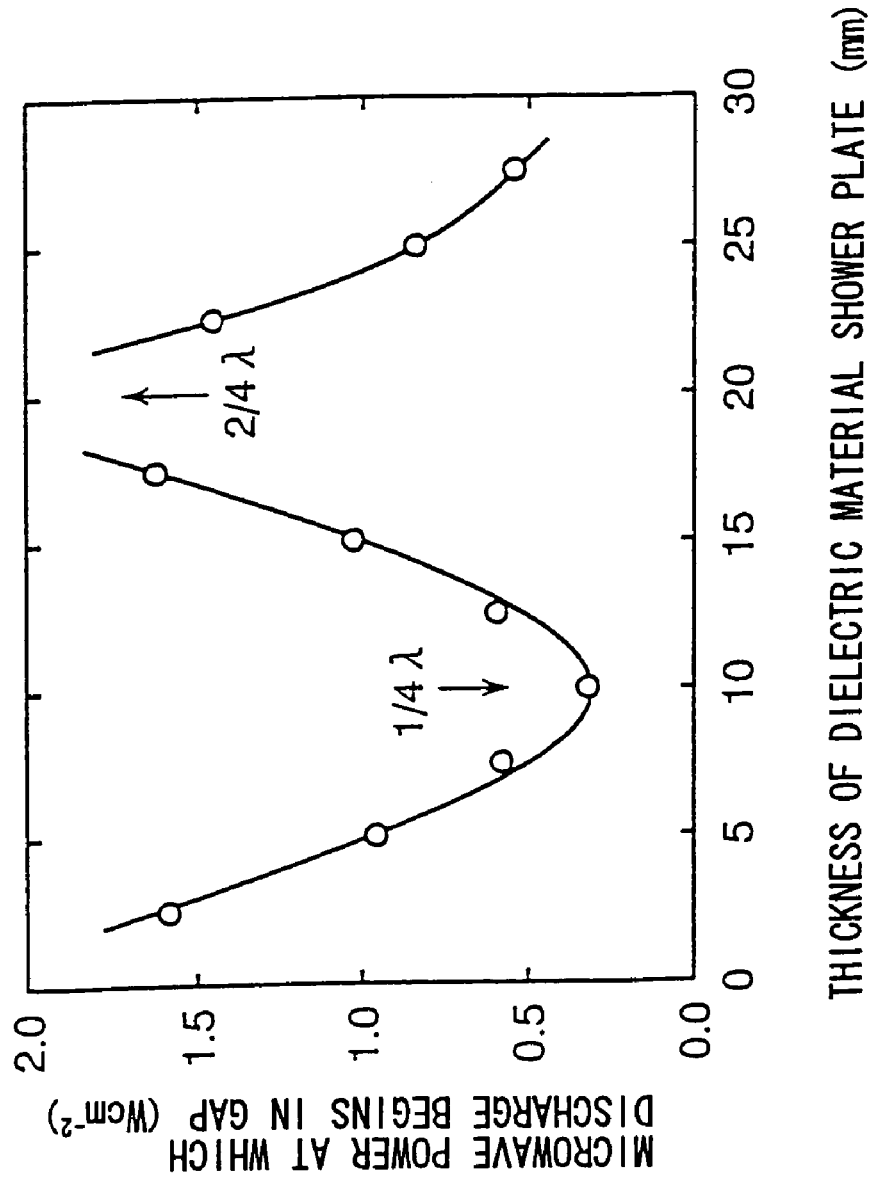
FIG. 8 is a graph showing a dependency of a microwave electric power density at which an electric discharge begins in a gap with respect to a thickness of a dielectric material shower plate.

FIG. 8 is a graph showing a result of measurement of a power density of the microwave at which a discharge begins in the gap 104 when the thickness of the dielectric material shower plate 103 is varied while the thickness of the dielectric material part is fixed to 30 mm. It can be appreciated that the power density of the microwave at which a discharge begins in the gap periodically varies with the thickness of the dielectric material shower plate 103. If a discharge occurs in the gap, the plasma in the process space becomes unstable, and, thus, such a discharge must be positively prevented. In order to prevent the discharge, the thickness of the dielectric material shower plate 103 is determined so that the gap is located at a position of a node of the standing wave of the microwave electric field. That is, the thickness of the dielectric material shower plate can be an integral multiple of a half of the wavelength in the corresponding part. It can be appreciated from FIG. 8 that a discharge most hardly occurs when the thickness of the dielectric material shower plate 103 is 20 mm, and most easily occurs when the thickness is 10 mm. These values correspond to a half and a quarter of the wavelength, respectively.

In the conventional structure, since the thickness of the shower plate was determined based on only a mechanical strength thereof and a conductance of the gas, there were many cases in which a discharge occurs in the gap and, thus, it was difficult to supply a large power to the plasma. In the structure of the present invention, no discharge occurs in the gap 104 when a large power is supplied to the plasma, and, thereby, it is possible to continuously excite stable, high-density plasma.

Figure 9:
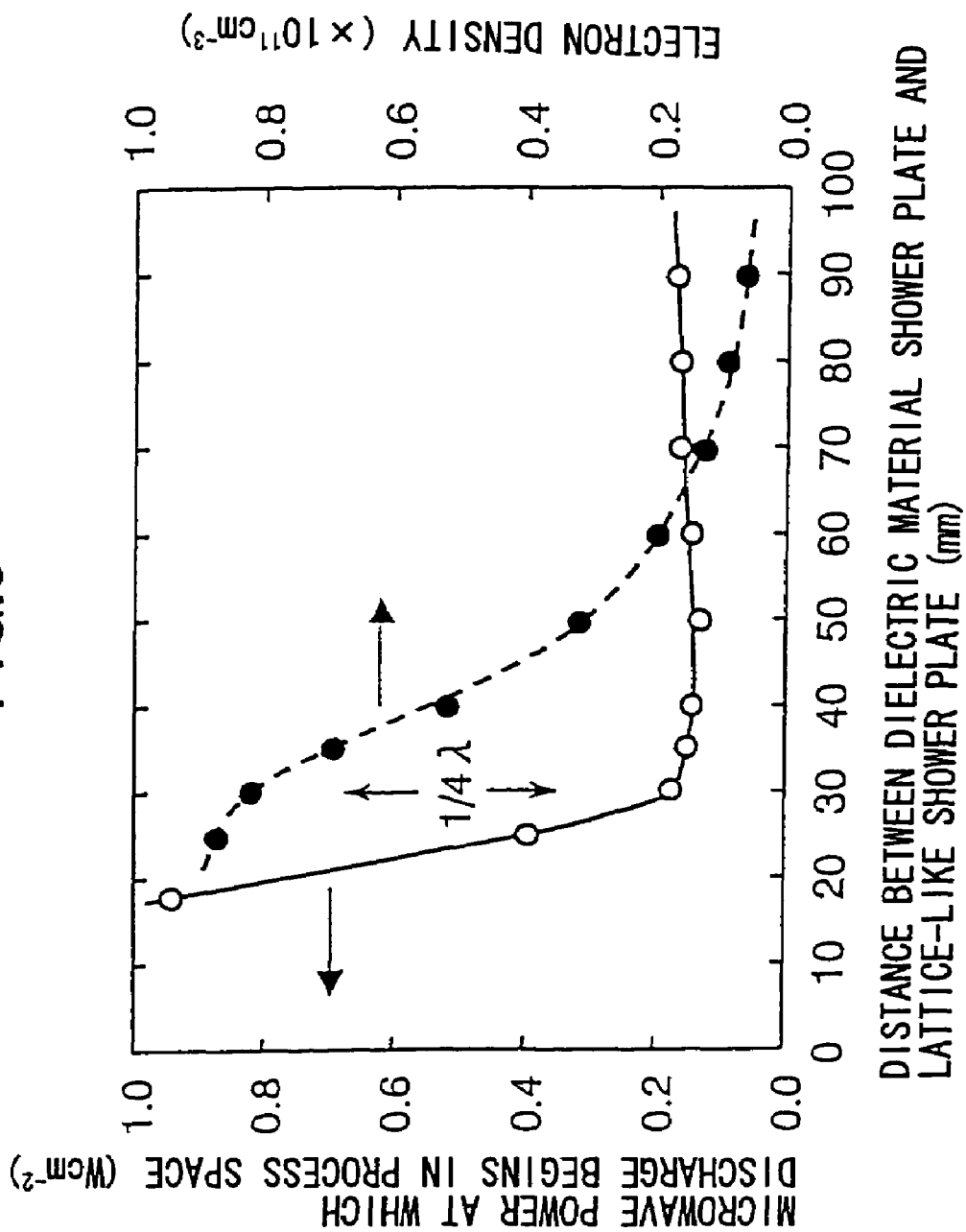
FIG. 9 is a graph showing a dependency of a microwave electric power density at which an electric discharge begins in a process space with respect to an interval between a dielectric material shower plate and a lattice-like shower plate.

FIG. 9 is a graph showing a result of measurement of an electron density hear the substrate 114 and a power density of the microwave at which a discharge begins in the process space (between the dielectric material shower plate 103 and the substrate 114) when a distance between the dielectric material shower plate 103 and the substrate 114 is varied.

When the distance between the dielectric material shower plate 103 and the substrate 114 becomes larger than a quarter of the wavelength, a discharge abruptly becomes to be difficult to occur in the process space. This can be explained as follows. The lattice-like shower plate 111 constituted by a metal serves a short-circuit plane for the microwave if the lattice interval is sufficiently shorter than the wavelength of the microwave. After the microwave is supplied to the chamber, the wave incident on the lattice-like shower plate 111 and the reflected wave reflected near the surface of the lattice-like shower plate 111 together form a standing wave. If the distance between the dielectric material shower plate 103 and the lattice-like shower plate 111 is longer than a quarter of the wavelength, a loop of the standing wave of the microwave electric field is present in the plasma space, and a discharge begins at a position where the electric field is strong. Immediately after the discharge begins, high-density plasma is generated near the surface on which the microwave is incident by using the plasma as a seed. On the other hand, if the distance between the dielectric material shower plate 103 and the lattice-like shower plate 111 is shorter than a quarter of the wavelength, the microwave electric field is maximized in the surface of the dielectric material shower plate 103, but the intensity of the electric field decreases as the distance decreases, which results in less discharge.

It can be interpreted from FIG. 9 that the electron density hear the substrate decreases as the distance between the dielectric material shower plate 103 and the lattice-like shower plate 111 increases. This is because the electron density decreases as the distance from the surface on which the microwave is incident increases since the plasma is excited near the surface on which the microwave is incident and the plasma diffuses toward the substrate. In order to achieve a high-speed process at a low microwave power, it is preferable that a discharge easily occurs in the process space and the electron density near the substrate is high. In order to satisfy both requirements, it is preferable to set the distance between the dielectric material shower plate 103 and the lattice-like shower plate 111 to be equal to a quarter of the wavelength.

Figure 10:
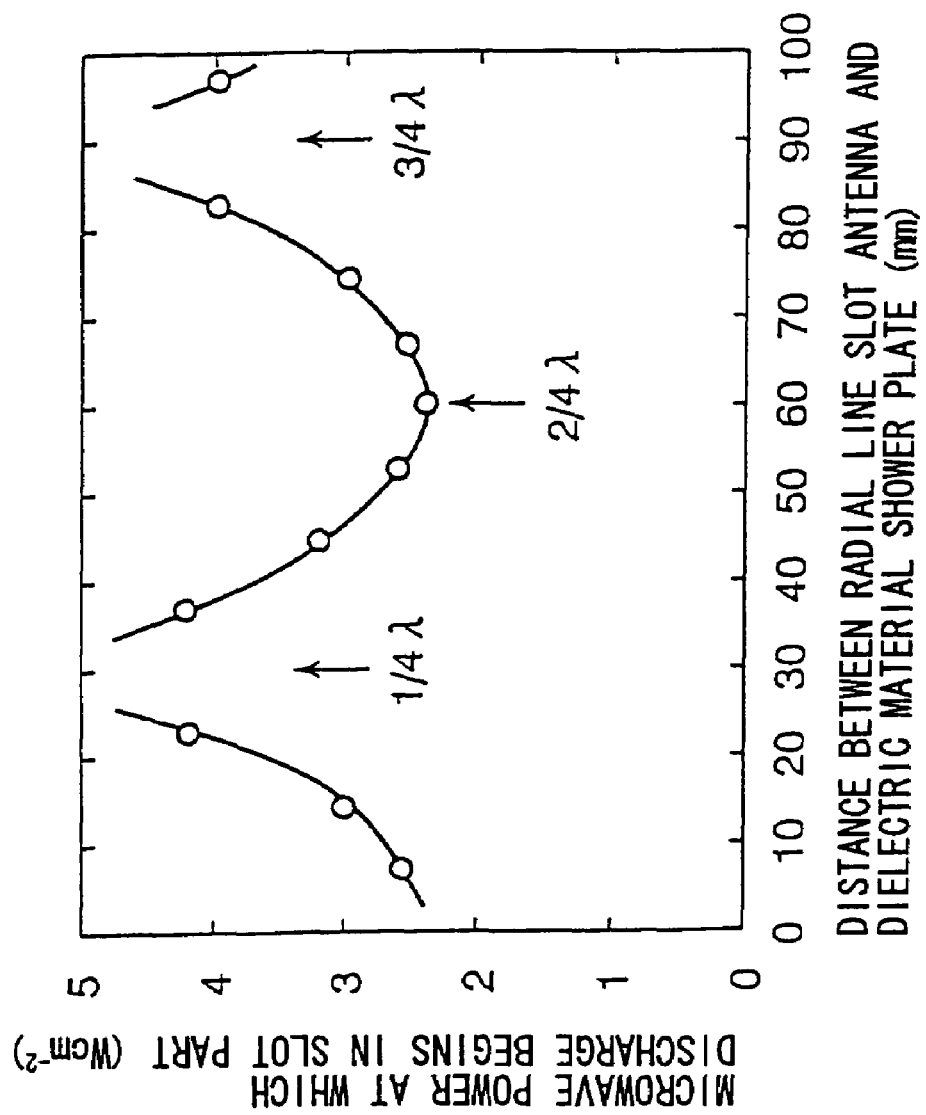
FIG. 10 is a graph showing a dependency of a microwave electric power density at which an electric discharge begins in a slot part with respect to an interval between a radial line slot antenna and a dielectric material shower plate.

FIG. 10 is a graph showing a result of measurement of a power density of the microwave at which a discharge begins in the slot part of the antenna 110 when the distance between the radial line slot antenna 110 and the dielectric material shower plate 103 is varied while the thickness of the dielectric material part is fixed to 30 mm. It can be appreciated that the power density of the microwave at which a discharge begins in the slot part periodically varies with the distance between the radial line slot antenna 110 and the dielectric material shower plate 103. If a discharge occurs in the slot part, the antenna 110 is damaged, and the plasma in the process space becomes unstable, and, thus, such a discharge must be positively prevented. In order to prevent the discharge in the slot part, the distance between the antenna 111 and the dielectric material shower plate 103 is determined so that the surface of the antenna 110 is located at a position of a node of the standing wave of the microwave electric field. When the surface of the dielectric material shower plate 103 facing the antenna corresponds to a loop of the standing wave of the microwave electric field, that is, in a case in which eth surface of the dielectric material separation wall facing the antenna and the surface of the dielectric material shower plate 103 facing substrate is set equal to an odd multiple of a quarter of the wavelength in the corresponding part, the distance between the antenna 110 and the dielectric material shower plate 103 can be an odd multiple of a quarter of the wavelength. It can be appreciated from FIG. 10 that a discharge most hardly occurs when the distance between the antenna 110 and the dielectric material shower plate 103 is 30 mm and 90 mm, and most easily occurs when the distance is 60 mm. These values correspond to a quarter, two quarters and three quarters of the wavelength, respectively.

In the conventional structure, since there were many cases in which a discharge easily occurs in the slot part of the antenna 110 and, thus, it was difficult to supply a large power to the plasma. In the structure of the present invention, no discharge occurs in the slot part when a large power is supplied to the plasma, and, thereby, it is possible to continuously excite stable, high-density plasma.

As mentioned above, by using the apparatus according to the present invention, it can be achieved to apply a high-efficiency RF bias to a substrate and to generate a high-efficiency microwave plasma, and attempts can be made to reduce an area occupied by the apparatus by miniaturization of an RF power source or a microwave power source and to reduce a cost of the apparatus. Further, since there is no discharge occurs in the gap between the dielectric material separation wall and the dielectric material shower plate 103 or the slot part of the radial line slot antenna 110 even when a microwave having a large power is supplied, more high-density and stable plasma can be generated, which realizes a high-productivity process. Since excessive dissociation of the process gas is suppressed and there is no impurity contamination, a high-performance process, which innovates the conventional plasma process, can be achieved.

EMBODIMENT 2

A description will now be given, with reference to FIG. 11 and FIG. 12, of a plasma processing apparatus according to a second embodiment of the present invention. FIG. 11 is a plan view of a lattice-like shower plate 600 provided in the plasma processing apparatus according to the second embodiment of the present invention viewed from a side of a substrate. FIG. 12 is a cross-sectional view taken along a line XII-XII of FIG.

11. The plasma processing apparatus according to the second embodiment of the present invention is the same as the plasma processing apparatus according to the first embodiment of the present invention shown in FIG. 1 except for the lattice-like shower plate 600 shown in FIG. 11, and descriptions thereof will be omitted.

As shown in FIG. 11, the lattice-like shower plate 600 comprises a main pipe 601, branch pipes 602, process gas discharge parts 603 (hatched portions) and lattice-like shower plate gas supply ports 604. As shown in FIG. 12, each of the branch pipes 602 has a film 606. It should be noted that a circle 605 indicated by a dotted line indicates an area facing the substrate.

In the present embodiment, the main pipe 601 is formed of an alumina ceramic having a porosity of 0.03%, and the branch pipes 602 are formed of a porous alumina ceramic having a porosity of 32%. The branch pipes 602 are positioned in a lattice arrangement, and the main pipe 601 and the branch pipes 602 are joined to each other by a ceramic-type adhesive. Accordingly, openings 607 are formed by the main pipe 601 and the branch pipes 602. The porous alumina ceramic has a nature to transmit gas therethrough, and, thus, a pipe made of such a material serves as a shower plate by setting a pressure of inside the pipe appropriately higher than a pressure outside the pipe. If the porous alumina ceramic is used for a shower plate, gas can be discharged more evenly than a case in which many gas discharge holes are provided as in the above-mentioned first embodiment. Parts of the surfaces of branch pipes 602 other than the gas discharge parts are covered by the film 606 so as to prevent gas from being discharged therethrough. The film 606 is made of an alumina ceramic having a thickness of 220 μm and a porosity of 0.8%.

The alumina ceramic has an excellent durability with respect to corrosive gas plasma, and a shower plate having a long service life can be constituted. On the other hand, since the alumina ceramic does not have an electric conductivity, there is no effect to increase an area of a grounded surface to which the plasma contacts, and, thus, it is not suitable for a process such as a reactive ion etching or the like in which a high-energy ions must be incident on the surface of the substrate. Accordingly, the apparatus according to the present embodiment is preferably used for resist ashing or film deposition such as CVD, oxidation or nitriding.

In the present embodiment, although the lattice-like shower plate 600 is formed of an alumina ceramic, the shower plate 600 may be formed of an aluminum nitride ceramic having a high thermal conductivity. Alternatively, a conductive alumina ceramic containing a large amount of metal such as aluminum or stainless steel. In such a case, since there is an effect of increasing the area of the grounded surface to which the plasma contacts, the shower plate is applicable to a process in which high-energy ions must be incident on the surface of the substrate.

EMBODIMENT 3

A description will now be given, with reference to FIG. 13 and FIG. 14, of a plasma processing apparatus according to a third embodiment of the present invention. FIG. 13 is a plan view of a lattice-like shower plate 700 provided in the plasma processing apparatus according to the third embodiment of the present invention viewed from a side of a substrate. FIG. 14 is a cross-sectional view taken along a line XIV-XIV of FIG. 13. The plasma processing apparatus according to the third embodiment of the present invention is the same as the plasma processing apparatus according to the first embodiment of the present invention shown in FIG. 1 except for the lattice-like shower plate 700 shown in FIG. 13, and descriptions thereof will be omitted.

The lattice-like shower plate 700 shown in FIG. 13 comprises gas introducing passages 701, process gas discharging holes 702, lattice-like shower plate gas supply ports 703, a lattice-like shower plate body 705 and a lattice-like shower plate cover 706. It should be noted that a circle 704 indicated by a dotted line indicates an area corresponding to a substrate.

The gas introducing passages 701 having a square cross section are formed in a grid, and the opening 707 is formed between adjacent gas introducing passages so as to let plasma and gas pass therethrough. The lattice-like shower plate body 705 and the lattice-like shower plate cover 706 are formed of aluminum containing 3%-magnesium, and are joined to each other by electron beam welding. The lattice-like shower plate body 705 and the lattice-like shower plate cover 706 are subjected to a heat treatment within a fluorine gas atmosphere after the electron beam welding so as to improve a resistance with respect to a corrosive gas, and a mixture film of magnesium fluoride and aluminum fluoride is formed thereon.

Since the present embodiment uses a material having a small resistivity and a large cross-sectional area of paths through which the RF current of the lattice-like shower plate 700 flows, as compared to the above-mentioned first embodiment, the effect to reduce an impedance between the plasma and the ground is high. That is, a plasma apparatus having a higher power efficiency can be constituted. It should be noted that, in the present embodiment, although the lattice-like shower plate 700 is formed of aluminum, the shower plate may be formed of a stainless steel or a high-purity aluminum containing stainless steel.

EMBODIMENT 4

Figure 15:
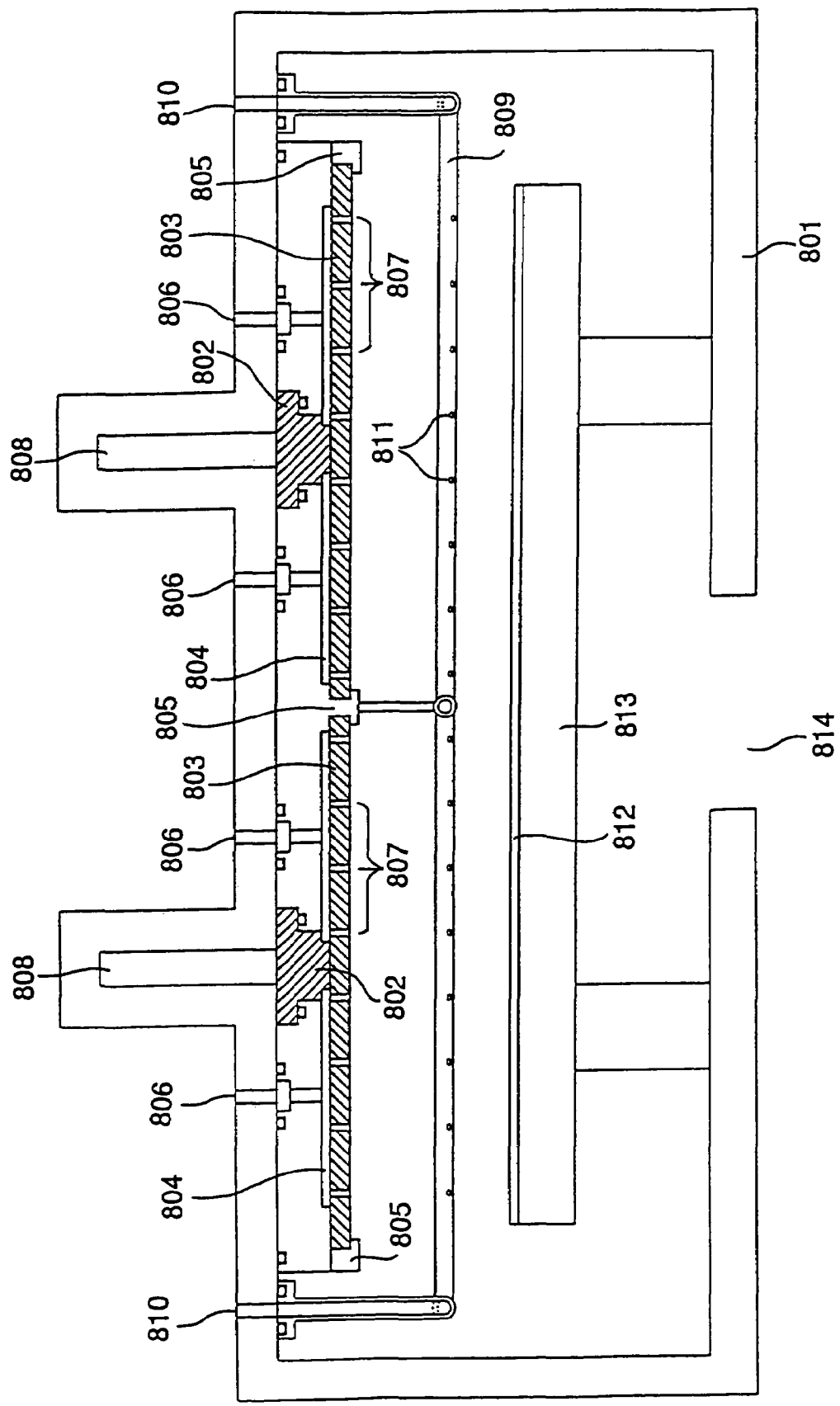
FIG. 15 a cross-sectional view of a plasma processing apparatus according to a fourth embodiment of the present invention.

FIG. 15 is a cross-sectional view of a plasma processing apparatus according to a fourth embodiment of the present invention. The plasma processing apparatus according o the fourth embodiment of the present invention comprises a vacuum chamber 801, a dielectric material separation wall 802, dielectric material shower plates 803, a gap 804, a shower plate fixing jig 805, plasma excitation gas supply ports 806, plasma excitation gas discharge holes 807, microwave guides 808, a lattice-like shower plate 809, process gas supply ports 810, process gas discharge holes 811, a stage 813 and an exhaust port 814. A substrate 812 to be processed by plasma is placed on the stage 813.

In the present embodiment, the vacuum chamber is formed of aluminum; the dielectric material separation wall 802 is formed of aluminum oxide; the dielectric material shower plates 803 are formed of aluminum nitride; and the shower plate fixing jig 805 is formed of aluminum. The lattice-like shower plate 809 has the same structure as that of one of the above-mentioned first to third embodiments, and is formed of a high-concentration aluminum containing stainless steel which is subject to an oxidation passivation treatment, similar to the above-mentioned first embodiment. The frequency of the microwave for plasma excitation is 2.45 GHz. The substrate 812 is a square glass substrate for a liquid crystal display, and its size is 550×650 mm².

Each of the microwave guides 808 is a single mode square waveguide extending in a direction perpendicular to the plane of the drawing, and a lower surface thereof is surrounded by a dielectric material wall and other parts are surrounded by meal walls. The microwave is generated by a single microwave power source, and is supplied by being distributed to the two microwave guides 808 near the center portion of the apparatus. A part of the microwave transmitting in the microwave guides 808 leaks from the dielectric material separation wall 802, and is introduced into the vacuum chamber 801 via the dielectric material shower plate 803 so as to excite plasma. When the plasma is excited, a surface wave is excited in the vicinity of a boundary between the plasma and the dielectric material shower plates 803 which surface wave propagates along the surface of the dielectric material shower plates 803. Uniform plasma over a large area can be obtained by exciting a uniform surface wave. In the present embodiment, two dielectric material shower plates 803 are provided, and these shower plates are electrically separated from each other by the shower plate fixing jig 805 so as to prevent the surface waves propagating the surfaces of these shower plates from interfering with each other.

The dielectric shower plates 803, the lattice-like shower plate 809 and the substrate 812 are arranged parallel to each other. A distance between each of the dielectric shower plates 803 and the lattice-like shower plate 809 is set equal to a quarter (30 mm) of the wavelength of the microwave.

The plasma processing apparatus according to the present embodiment was used for manufacturing a back gate type TFT (thin film transistor) liquid crystal display device. The applied processes were: 1) silicon nitride film forming process; 2) a polycrystalline silicon film forming process on a silicon nitride film; 3) an n⁺ silicon film forming process on a polycrystalline silicon film; 4) a silicon film etching process; and 5) a silicon surface direct oxidation process. The following Table 2 indicates kinds of gasses and pressures used for the above-mentioned processes.

TABLE 2

Each process for manufacturing a liquid crystal display and process conditions thereof

| Process | Plasma excitation gas | Process gas | Pressure |
|---|---|---|---|
| 1: Silicon nitride film forming | Ar (900 sccm) | $S_iH_4$ (50 sccm) NH3 (70 sccm) | Approx. 67 Pa (500 mTorr) |
| 2: Polycrystalline silicon film forming | Ar (880 sccm) | $S_iH_4$ (60 sccm) H2 (60 sccm) | Approx. 67 Pa (500 mTorr) |
| 3: n⁺ silicon film forming | Ar (900 sccm) | $S_iH_4$ (60 sccm) $PH_3$ (20 sccm) | Approx. 67 Pa (500 mTorr) |
| 4: Silicon film etching | Ar (820 sccm) | $SF_6$ (250 sccm) HCl (50 sccm) | Approx. 27 Pa (200 mTorr) |
| 5: Silicon surface direct oxidizing | He (660 sccm) | $O_2$ (90 sccm) | Approx. 67 Pa (500 mTorr) |

Substrates of both semiconductors and liquid crystal displays have been increased in their sizes. It is technically difficult and takes a cost to transport a large-size substrate at a high speed without any problems. Additionally, an apparatus has become large-scaled due to an increase in the size of the substrate, and an initial investment and a running cost of the apparatus or a manufacturing plant (clean room) has been extremely increased. Accordingly, there is a great demand to consecutively perform many processes by a single apparatus so as to carry out manufacturing without transporting a substrate.

In the present embodiment, the processes 1) to 3) can be consecutively performed without moving the substrate 812 by changing the gas. The processes 4) and 5) are the same. The plasma processing apparatus according to the present embodiment can deal with such consecutive processes in a flexible manner because of the feature that many plasma processes such as film deposition, etching, oxidation, nitriding or ashing can be performed by a single apparatus by changing gasses discharged from the dielectric material shower plate 803 and the lattice-like shower plate 809.

The following Table 3 indicates a comparison of results of execution of the same process by a parallel flat plate type plasma processing apparatus (conventional apparatus), which is widely used in the recent manufacturing of liquid crystal displays, and the plasma processing apparatus according to the present embodiment.

TABLE 3

| Process | Case of using conventional apparatus | Case of using apparatus of the present invention |
|---|---|---|
| 1: Silicon nitride film forming | Withstand voltage: 4.2 MV/cm Film deposition rate: 120 nm/min | Withstand voltage: 12.4 MV/cm Film deposition rate: 310 nm/min |
| 2: Polycrystalline silicon film forming | Amorphous (0.2 cm²/V · sec) Film deposition rate: 78 nm/min | Polycrystal (0.2 cm²/V · sec) Film deposition rate: 93 nm/min |
| 3: n⁺ silicon film forming | Resistivity: 2.3 Ωcm Film deposition rate: 58 nm/min | Resistivity: 0.7 Ωcm Film deposition rate: 85 nm/min |
| 4: Silicon film etching | Etching rate: 280 nm/min | Etching rate: 720 nm/min |
| 5: Silicon surface direct oxidizing | Oxidation film thickness: 7 nm (oxidation time, 3 min.) | Oxidation film thickness: 28 nm (oxidation time, 3 min.) |

The silicon nitride film is used as a gate insulating film or an interlayer insulating film, and is required to be deposited at a high rate in the form of a film having a high withstand voltage and a small leak current. In the apparatus according to the present embodiment, since the energy of ions incident on the surface on which the film is deposited is as low as one-third of that of the conventional apparatus and there is no damage to the thin film due to ion bombardment, a high-quality silicon nitride film is formed, which has a withstand voltage close to three times that of the conventional one. Further, since the electron density is higher than the conventional parallel flat plate type plasma apparatus by about one order ($>2\times10^{12}$ cm$^{-3}$), a film deposition rate is high and productivity is remarkably increased.

The silicon film is used for a channel part, which is an important part of the TFT. A silicon film having a high channel moving speed must be deposited on an insulating film so as to improve a current drive performance of a transistor. In the conventional apparatus, the moving speed was very low (0.2 cm²/V·sec) since it was able to form only an amorphous film. Although a polycrystalline silicon film having a high moving speed can be obtained by performing a laser annealing treatment which polycrystallizes an amorphous film by irradiating a laser beam, this method is not practical since it takes a very long time. When the microwave plasma processing apparatus according to the present invention is used, a polycrystalline silicon film having a high moving speed of about 280 cm²/V·sec was able to be deposited by a CAD method at a low substrate temperature of 250° C. without annealing. Additionally, the microwave plasma processing apparatus according to the present invention is capable of depositing a film at a high rate and has an excellent productivity, and provides an innovative thin film forming technology.

The n+ silicon film is used for a source-drain contact part of the TFT, and it is required to provided a high carrier density and a small resistivity so as to improve a current drive performance of a transistor. When the apparatus according to the present invention was used, there was no damage to a film since the energy of ions irradiated to a surface on which a film is deposited is small, and it was able to obtain a film having a less resistivity due to an improvement in an activation rate of carries.

The 4) silicon film etching process and 5) silicon direct oxidation process in Table 3 were consecutively performed by the same apparatus without taking the substrate 812 out of the apparatus. In these processes, a gap between a source and a drain of the back gate type TFT was etched, and, thereafter, the n+ silicon film (amorphous or micro crystal) for a source-drain contact of the substrate base was changed into an insulating material ($S_iO_2$) by oxidation so as to insulate between the source and the drain. Although the etching must be performed at a high rate, an etching rate of more than twice as high as that of the conventional one was obtained due to a high plasma density when the apparatus according to the present invention was used.

In order to achieve an insulation between the source and the drain, the N+ silicon film (thickness of the film is about 15 mm) must be completely oxidized up to the inside thereof. At this time, the temperature of the substrate must be lower than 300° C. If a low-temperature plasma oxidation is performed by the conventional apparatus, the oxidation progresses up to a depth of only about 7 mm. Accordingly, the film cannot be oxidized in its entirety, and an insulation between the source and the drain cannot be achieved. On the other hand, according to the apparatus of the present embodiment, the source and the drain can be completely insulated from each other by oxidizing the n+ silicon film in its entirety since the oxidation progresses up to a depth of 28 mm at a substrate temperature of 300° C. for 3 minutes. This is because a large amount of oxygen radicals, which are seeds of oxidation, are generated due to a high electron density, and diffusion of the oxygen radicals into the oxidation film is promoted by a large amount of ions irradiated onto the surface of the substrate.

The present invention is not limited to the specifically disclosed embodiments, and variations and modifications may be made without departing from the scope of the present invention.

The invention claimed is:

1. A plasma processing apparatus for applying a process to a substrate to be processed, the plasma processing apparatus comprising:

a chamber of which interior can be depressurized;

a gas supply system constructed and arranged to supply a first gas to the chamber;

an exhaust gas system configured and arranged to exhaust the first gas supplied to the chamber and to depressurize the chamber;

a part of a wall constituting the chamber being a flat plate dielectric material plate formed of a material which passes a microwave therethrough substantially without a loss;

a flat plate dielectric material shower plate provided between the dielectric material plate and plasma excited in the chamber, said dielectric material shower plate being formed of a material which passes a microwave therethrough substantially without a loss;

a plurality of gas discharge holes being formed in the dielectric material shower plate so that at least a part of the first gas supplied by the gas supply system is discharged through the plurality of gas discharge holes through a gap between the dielectric material plate and the dielectric material shower plate;

a flat plate slot antenna provided on an outer side of the chamber with the dielectric material plate interposed therebetween so as to supply a microwave for exciting plasma through the dielectric material plate;

a stage provided on an inner side of the chamber so as to hold the substrate to be processed; and a substantially flat shower head provided between the dielectric material shower plate and the substrate to be processed so as to discharge a second gas to a side of the substrate to be processed in which the second gas has a different composition than a composition of the first gas, said shower head having a plurality of openings which cause the first gas discharged from the dielectric material shower plate to pass therethrough and flow to the side of the substrate, wherein said dielectric material shower plate and said shower head are arranged substantially parallel to each other with a distance therebetween that is substantially equal to a multiple of a quarter of a wavelength of said microwave in a vacuum.

2. The plasma processing apparatus as claimed in claim 1, wherein a plurality of gas discharge holes are provided to the shower head on a side facing the substrate to be processed.

3. The plasma processing apparatus as claimed in claim 1, wherein said shower head is formed of a metal pipe having a plurality of gas discharge holes on a side facing the substrate to be processed, and the metal pipe is grounded.

4. The plasma processing apparatus as claimed in claim 3, wherein said metal pipe is formed of a stainless steel containing aluminum, and a surface thereof is covered by a passivation film mainly formed of aluminum oxide.

5. The plasma processing apparatus as claimed in claim 1, wherein said dielectric material plate and said dielectric material shower plate are arranged substantially parallel to each other, and a distance between a surface of said dielectric material plate facing said slot antenna and a surface of the dielectric material shower plate facing said substrate to be processed is substantially equal to an odd multiple of a quarter of a wavelength of said microwave.

6. The plasma processing apparatus as claimed in claim 1 wherein said slot antenna and said dielectric material plate are arranged substantially parallel to each other, and a distance therebetween is substantially equal to an odd multiple of a quarter of a wavelength of said microwave.

7. The plasma processing apparatus as claimed in claim 1, wherein a thickness of said dielectric material shower palate is an integral multiple of a half of a wavelength of said microwave.

8. The plasma processing apparatus as claimed in claim 7, wherein said slot antenna and said dielectric material plate are arranged substantially parallel to each other, and a distance therebetween is substantially equal to an odd multiple of a quarter of a wavelength of said microwave.

* * * * *